(12) United States Patent
Jang et al.

(10) Patent No.: US 10,657,884 B2
(45) Date of Patent: May 19, 2020

(54) ELECTRONIC DEVICE HAVING DISPLAY AND SENSOR AND METHOD FOR OPERATING THE SAME

(71) Applicant: Samsung Electronics Co., Ltd., Suwon-si, Gyeonggi-do (KR)

(72) Inventors: Eun-Taek Jang, Seoul (KR); Eun-Sook Seo, Yongin-si (KR); Dong-Kyoon Han, Seongnam-si (KR); Tae-Woong Lee, Seoul (KR); Dong-Hui Kim, Hwaseong-si (KR); Hong-Kook Lee, Seoul (KR); Kwang-Tai Kim, Suwon-si (KR); Dong-Hyun Yeom, Bucheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/689,630

(22) Filed: Aug. 29, 2017

(65) Prior Publication Data

US 2018/0061313 A1 Mar. 1, 2018

(30) Foreign Application Priority Data

Aug. 30, 2016 (KR) .......................... 10-2016-0110893

(51) Int. Cl.
*G09G 5/00* (2006.01)
*G09G 3/3225* (2016.01)
(Continued)

(52) U.S. Cl.
CPC ......... *G09G 3/3225* (2013.01); *G06F 1/1626* (2013.01); *G06F 1/1643* (2013.01); *H04M 1/0266* (2013.01); *H04M 1/22* (2013.01); *G09G 2320/0626* (2013.01); *G09G 2360/144* (2013.01); *H04M 1/72569* (2013.01); *H04M 2250/12* (2013.01)

(58) Field of Classification Search
CPC ... G09G 3/3225; G06F 1/1626; G06F 1/1643; H04M 1/22; H04M 1/0266; H04M 1/72569
USPC .................................................. 345/76, 207
See application file for complete search history.

(56) References Cited

U.S. PATENT DOCUMENTS

| | | | |
|---|---|---|---|
| 2004/0032382 A1* | 2/2004 | Cok | ..................... G09G 3/3216 345/82 |
| 2005/0087671 A1 | 4/2005 | Park | |

(Continued)

FOREIGN PATENT DOCUMENTS

| | | |
|---|---|---|
| EP | 2 432 196 A1 | 3/2012 |
| KR | 10-0810514 B1 | 3/2008 |

(Continued)

*Primary Examiner* — Adam J Snyder
(74) *Attorney, Agent, or Firm* — Jefferson IP Law, LLP

(57) ABSTRACT

An electronic device having a display and a sensor and methods for operating the same are provided. The electronic device includes a housing, a display disposed on a surface of the housing, a sensor mounted under the display inside the housing to detect light received through the display, and a processor electrically connected with the display and the sensor, wherein the processor is configured to determine an illuminance of an outside of the housing using detection data obtained by the sensor while the display displays an image and relevant information between the display and the sensor.

18 Claims, 16 Drawing Sheets

(51) Int. Cl.
    *H04M 1/22*           (2006.01)
    *H04M 1/02*           (2006.01)
    *G06F 1/16*            (2006.01)
    *H04M 1/725*         (2006.01)

(56) References Cited

U.S. PATENT DOCUMENTS

| | | | |
|---|---|---|---|
| 2008/0165115 A1 | 7/2008 | Herz et al. | |
| 2009/0295943 A1* | 12/2009 | Kim | H04N 5/217 348/231.99 |
| 2011/0187687 A1 | 8/2011 | Saitou et al. | |
| 2012/0069042 A1* | 3/2012 | Ogita | H04M 1/0264 345/589 |
| 2014/0132158 A1* | 5/2014 | Land | G09G 3/20 315/152 |
| 2014/0152632 A1* | 6/2014 | Shedletsky | G09G 5/10 345/207 |
| 2014/0183342 A1* | 7/2014 | Shedletsky | G06F 1/1637 250/215 |
| 2015/0070337 A1 | 3/2015 | Bell et al. | |
| 2015/0130823 A1 | 5/2015 | Kim et al. | |
| 2017/0092228 A1* | 3/2017 | Cote | G09G 3/3225 |

FOREIGN PATENT DOCUMENTS

KR         10-1179785 B1     9/2012
KR   10-2015-0055503 A     5/2015

* cited by examiner

ELECTRONIC DEVICE HAVING DISPLAY AND SENSOR AND METHOD FOR OPERATING THE SAME

CROSS-REFERENCE TO RELATED APPLICATION(S)

This application claims the benefit under 35 U.S.C. § 119(a) of a Korean patent application filed on Aug. 30, 2016 in the Korean Intellectual Property Office and assigned Serial number 10-2016-0110893, the entire disclosure of which is hereby incorporated by reference.

TECHNICAL FIELD

The present disclosure relates to electronic devices having a display and a sensor and methods for operating the same. More particularly, the present disclosure relates to an electronic device having a display and a sensor and a method for operating the same, wherein an illuminance sensor may be mounted in a screen area of the display.

BACKGROUND

Electronic devices may carry out various functions in an integrated manner. For example, smartphones or other portable terminals are advancing to allow users more convenience with better performance.

Recently, portable terminals come with various sensors to implement diversified functionalities. For example, a potable terminal may have an illuminance sensor on the front surface. The brightness of the display may be controlled using the measured brightness, allowing the user better visibility and more efficient usage of power in the portable terminal.

Generally, the illuminance sensor is embedded in the electronic device. For example, the illuminance sensor may be mounted at a predetermined position in the circumference of the front panel, e.g., the display, to receive light from its surroundings.

The illuminance sensor may be placed in the circumference of the display, e.g., in a non-display area surrounding the screen area where images are displayed. Such arrangement, however, imposes limits in designing the electronic device and requires consideration of the position of the illuminance sensor in designing the parts to be equipped in the electronic device. It is a commonplace practice to put the illuminance sensor in the vicinity of, e.g., the front camera or speaker and the display. Thus, the position of the illuminance sensor should be determined in relation to such other parts, and interference with other parts is an issue that should be taken into account in design.

An approach of the related art to address such limitations is to position the illuminance sensor in the screen area of the display in which case, however, the illuminance sensor may have difficulty in presenting an exact measurement for the surroundings due to influence by light emission from the display.

Meanwhile, red (R)/green (G)/blue (B) subpixels in the display may be subject to a deterioration after its expected lifespan. Therefore, a need exists for a method for making up for a lowering in the brightness nature of the display.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an electronic device having a display and a sensor and a method for operating the same, wherein an illuminance sensor may be mounted in a screen area of the display, unlike in the related art where an illuminance sensor is placed in an outer circumference of the screen area of the display. Relevant information between the display and the illuminance sensor may be put to use to present an exact illuminance with the influence by light emission from the display minimized.

Another aspect of the present disclosure is to provide an electronic device having a display and a sensor and a method for operating the same, wherein an illuminance sensor may be mounted in a screen area of a display, unlike in the related art where an illuminance sensor is placed in an outer circumference of the screen area of the display according to the related art. Detection data obtained by the illuminance sensor when an image is displayed on the display may be used to detect and compensate a deterioration of the display.

In accordance with an aspect of the present disclosure, an electronic device is provided. The electronic device includes a housing, a display disposed on a surface of the housing, a sensor mounted under the display inside the housing to detect light received through the display, and a processor electrically connected with the display and the sensor, wherein the processor may be configured to determine an illuminance of an outside of the housing using detection data obtained by the sensor while the display displays an image and relevant information between the display and the sensor.

In accordance with another aspect of the present disclosure, an electronic device is provided. The electronic device includes a housing, a display disposed on a surface of the housing, a sensor mounted under the display inside the housing to detect light received through the display, and a processor electrically connected with the display and the sensor, wherein the processor may be configured to adjust an attribute of the display using first detection data obtained by the sensor while a first image is displayed on the display and second detection data obtained by the sensor when a second image is displayed on the display.

In accordance with another aspect of the present disclosure, a method for operating an electronic device is provided. The method includes a display and a sensor may comprise obtaining detection data by the sensor for detecting light received through the display while the display displays an image and determining an illuminance of an outside using the obtained detection data and relevant information between the display and the sensor.

In accordance with another aspect of the present disclosure, a method for operating an electronic device is provided. The method includes a display and a sensor may comprise obtaining first detection data by the sensor for detecting light received through the display while a first image is displayed on the display, obtaining second detection data by the sensor while a second image is displayed on the display, and adjusting an attribute of the display using the first detection data and the second detection data.

According to an embodiment of the present disclosure, there may be provided a non-transitory computer-readable recording medium retaining a program executed on a computer, wherein the program may comprise commands executed by a processor to enable the processor to obtain detection data by the sensor for detecting light received through the display while the display displays an image and determine an illuminance of an outside using the obtained detection data and relevant information between the display and the sensor.

According to an embodiment of the present disclosure, there may be provided a non-transitory computer-readable recording medium retaining a program executed on a computer, wherein the program may comprise commands executed by a processor to enable the processor to obtain first detection data by the sensor for detecting light received through the display while a first image is displayed on the display, obtain second detection data by the sensor while a second image is displayed on the display, and adjust an attribute of the display using the first detection data and the second detection data.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following detailed description in conjunction with the accompanying drawings, in which.

Throughout the drawings, like reference numerals will be understood to refer to like parts, components, and structures.

DETAILED DESCRIPTION

Figure 1:
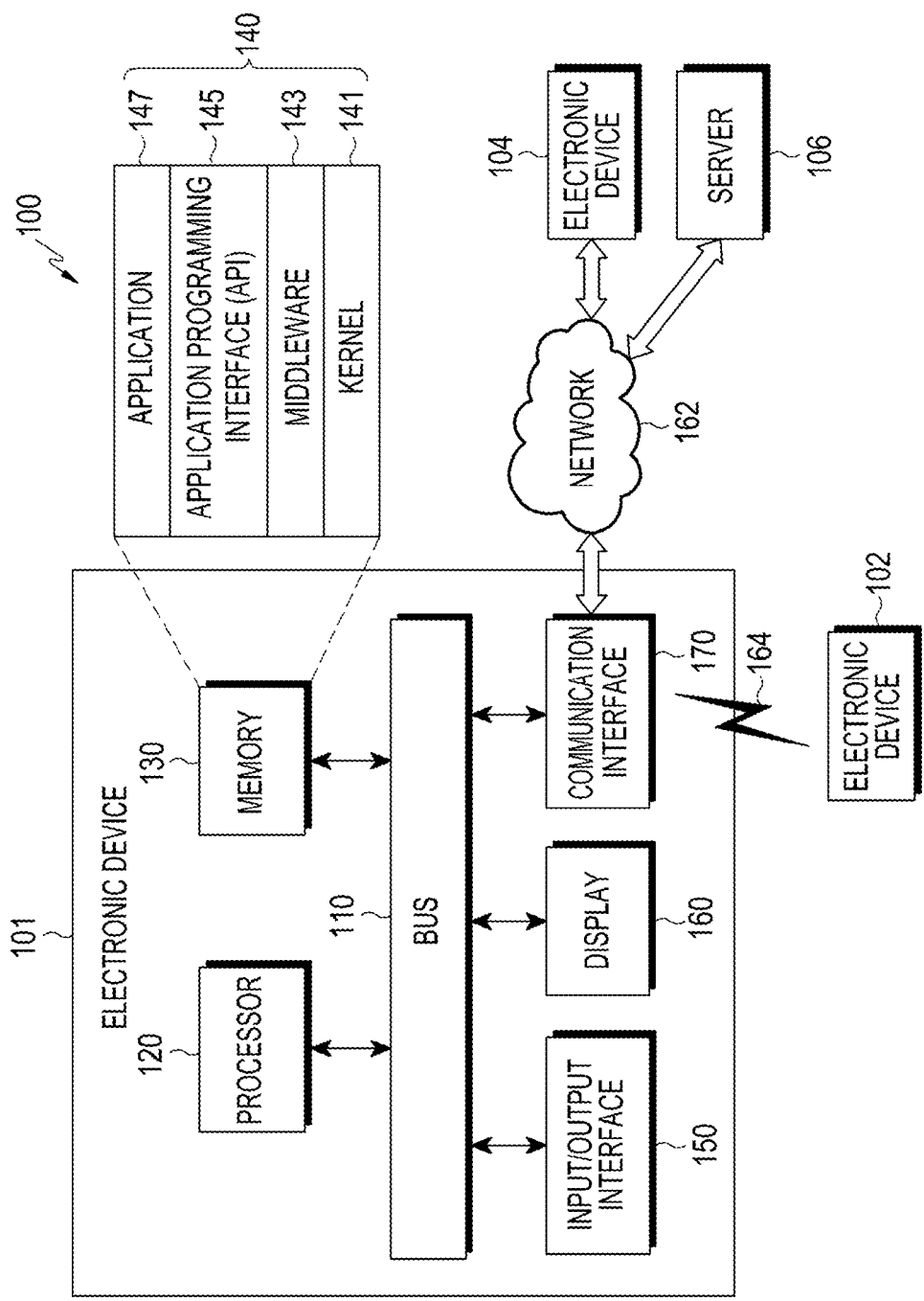
FIG. 1 is a block diagram illustrating an electronic device in a network environment according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

As used herein, the terms "configured to" may be interchangeably used with other terms, such as "suitable for," "capable of," "modified to," "made to," "adapted to," "able to," or "designed to" in hardware or software in the context. Rather, the term "configured to" may mean that a device can perform an operation together with another device or parts. For example, the term "processor configured (or set) to perform A, B, and C" may mean a generic-purpose processor (e.g., a central processing unit (CPU) or application processor (AP)) that may perform the operations by executing one or more software programs stored in a memory device or a dedicated processor (e.g., an embedded processor) for performing the operations.

For example, examples of the electronic device according to embodiments of the present disclosure may include at least one of a smartphone, a tablet personal computer (PC), a mobile phone, a video phone, an e-book reader, a desktop PC, a laptop computer, a netbook computer, a workstation, a server, a personal digital assistant (PDA), a portable multimedia player (PMP), a moving picture experts group phase 1 or phase 2 (MPEG-1 or MPEG-2) audio layer 3 (MP3) player, a medical device, a camera, or a wearable device. The wearable device may include at least one of an accessory-type device (e.g., a watch, a ring, a bracelet, an anklet, a necklace, glasses, contact lenses, or a head-mounted device (HMD)), a fabric- or clothes-integrated device (e.g., electronic clothes), a body attaching-type device (e.g., a skin pad or tattoo), or a body implantable device. In some embodiments, examples of the smart home appliance may include at least one of a television, a digital versatile disc (DVD) player, an audio player, a refrigerator, an air conditioner, a cleaner, an oven, a microwave oven, a washer, a drier, an air cleaner, a set-top box, a home automation control panel, a security control panel, a television (TV) box (e.g., Samsung HomeSync™, Apple TV™, or Google TV™), a gaming console (Xbox™, PlayStation™), an electronic dictionary, an electronic key, a camcorder, or an electronic picture frame.

According to an embodiment of the present disclosure, the electronic device may include at least one of various medical devices (e.g., diverse portable medical measuring devices (a blood sugar measuring device, a heartbeat measuring device, or a body temperature measuring device), a magnetic resource angiography (MRA) device, a magnetic resource imaging (MRI) device, a computed tomography (CT) device, an imaging device, or an ultrasonic device), a navigation device, a global navigation satellite system (GNSS) receiver, an event data recorder (EDR), a flight data recorder (FDR), an automotive infotainment device, an sailing electronic device (e.g., a sailing navigation device or a gyro compass), avionics, security devices, vehicular head units, industrial or home robots, drones, automatic teller's machines (ATMs), point of sales (POS) devices, or internet of things (IoT) devices (e.g., a bulb, various sensors, a sprinkler, a fire alarm, a thermostat, a street light, a toaster, fitness equipment, a hot water tank, a heater, or a boiler). According to various embodiments of the disclosure, examples of the electronic device may at least one of part of a piece of furniture, building/structure or vehicle, an electronic board, an electronic signature receiving device, a projector, or various measurement devices (e.g., devices for measuring water, electricity, gas, or electromagnetic waves). According to embodiments of the present disclosure, the electronic device may be flexible or may be a combination of the above-enumerated electronic devices. According to an embodiment of the disclosure, the electronic devices are not limited to those described above. As used herein, the term "user" may denote a human or another device (e.g., an artificial intelligent electronic device) using the electronic device.

FIG. 1 is a block diagram illustrating an electronic device in a network environment according to an embodiment of the present disclosure.

Referring to FIG. 1, according to an embodiment of the present disclosure, an electronic device 101 is included in a network environment 100. The electronic device 101 may include a bus 110, a processor 120, a memory 130, an input/output interface 150, a display 160, and a communication interface 170. In some embodiments, the electronic device 101 may exclude at least one of the components or may add another component. The bus 110 may include a circuit for connecting the components 110 to 170 with one another and transferring communications (e.g., control messages or data) between the components. The processor 120 may include one or more of a CPU, an AP, or a communication processor (CP). The processor 120 may perform control on at least one of the other components of the electronic device 101, and/or perform an operation or data processing relating to communication.

The memory 130 may include a volatile and/or non-volatile memory. For example, the memory 130 may store commands or data related to at least one other component of the electronic device 101. According to an embodiment of the present disclosure, the memory 130 may store software and/or a program 140. The program 140 may include, e.g., a kernel 141, middleware 143, an application programming interface (API) 145, and/or an application program (or "application") 147. At least a portion of the kernel 141, middleware 143, or API 145 may be denoted an operating system (OS). For example, the kernel 141 may control or manage system resources (e.g., the bus 110, processor 120, or a memory 130) used to perform operations or functions implemented in other programs (e.g., the middleware 143, API 145, or application program 147). The kernel 141 may provide an interface that allows the middleware 143, the API 145, or the application 147 to access the individual components of the electronic device 101 to control or manage the system resources.

The middleware 143 may function as a relay to allow the API 145 or the application 147 to communicate data with the kernel 141, for example. Further, the middleware 143 may process one or more task requests received from the application program 147 in order of priority. For example, the middleware 143 may assign a priority of using system resources (e.g., bus 110, processor 120, or memory 130) of the electronic device 101 to at least one of the application programs 147 and process one or more task requests. The API 145 is an interface allowing the application 147 to control functions provided from the kernel 141 or the middleware 143. For example, the API 133 may include at least one interface or function (e.g., a command) for filing control, window control, image processing or text control. For example, the input/output interface 150 may transfer commands or data input from the user or other external device to other component(s) of the electronic device 101 or may output commands or data received from other component(s) of the electronic device 101 to the user or other external devices.

The display 160 may include, e.g., a liquid crystal display (LCD), a light emitting diode (LED) display, an organic LED (OLED) display, or a microelectromechanical systems (MEMS) display, or an electronic paper display. The display 160 may display, e.g., various contents (e.g., text, images, videos, icons, or symbols) to the user. The display 160 may include a touchscreen and may receive, e.g., a touch, gesture, proximity or hovering input using an electronic pen or a body portion of the user. For example, the communication interface 170 may set up communication between the electronic device 101 and an external device (e.g., a first external electronic device 102, a second external electronic device 104, or a server 106). For example, the communication interface 170 may be connected with a network 162 through wireless communication 164 or wired communication and may communicate with an external device (e.g., the second external electronic device 104 or the server 106).

The wireless communication may include cellular communication which uses at least one of, e.g., long term evolution (LTE), LTE-advanced (LTE-A), code division multiple access (CDMA), wideband CDMA (WCDMA), universal mobile telecommunication system (UMTS), wireless broadband (WiBro), or global system for mobile communication (GSM). According to an embodiment of the present disclosure, the wireless communication may include at least one of, e.g., Wi-Fi, Bluetooth (BT), bluetooth low power (BLE), zigbee, near field communication (NFC), magnetic secure transmission (MST), radio frequency, or body area network (BAN). According to an embodiment of the present disclosure, the wireless communication may include global navigation satellite system (GNSS). The GNSS may be, e.g., global positioning system (GPS), global navigation satellite system (Glonass), Beidou navigation satellite system (hereinafter, "Beidou") or Galileo, or the European global satellite-based navigation system. Hereinafter, the terms "GPS" and the "GNSS" may be interchangeably used herein. The wired connection may include at least one of, e.g., universal serial bus (USB), high definition multimedia interface (HDMI), recommended standard (RS)-232, power line communication (PLC), or plain old telephone service (POTS). The network 162 may include at least one of telecommunication networks, e.g., a computer network (e.g., local area network (LAN) or wide area network (WAN)), Internet, or a telephone network.

The first external electronic device 102 and the second external electronic device 104 each may be a device of the same or a different type from the electronic device 101. According to an embodiment of the present disclosure, all or some of operations executed on the electronic device 101 may be executed on another or multiple other electronic devices (e.g., the first external electronic devices 102 and the second external electronic device 104 or the server 106). According to an embodiment of the present disclosure, when the electronic device 101 should perform some function or service automatically or at a request, the electronic device 101, instead of executing the function or service on its own or additionally, may request another device (e.g., the first external electronic device 102 and the second external electronic device 104 or the server 106) to perform at least some functions associated therewith. The other electronic device (e.g., the first external electronic device 102 and the second external electronic device 104 or the server 106) may execute the requested functions or additional functions and transfer a result of the execution to the electronic device 101. The electronic device 101 may provide a requested function or service by processing the received result as it is or additionally. To that end, a cloud computing, distributed computing, or client-server computing technique may be used, for example.

Figure 2:
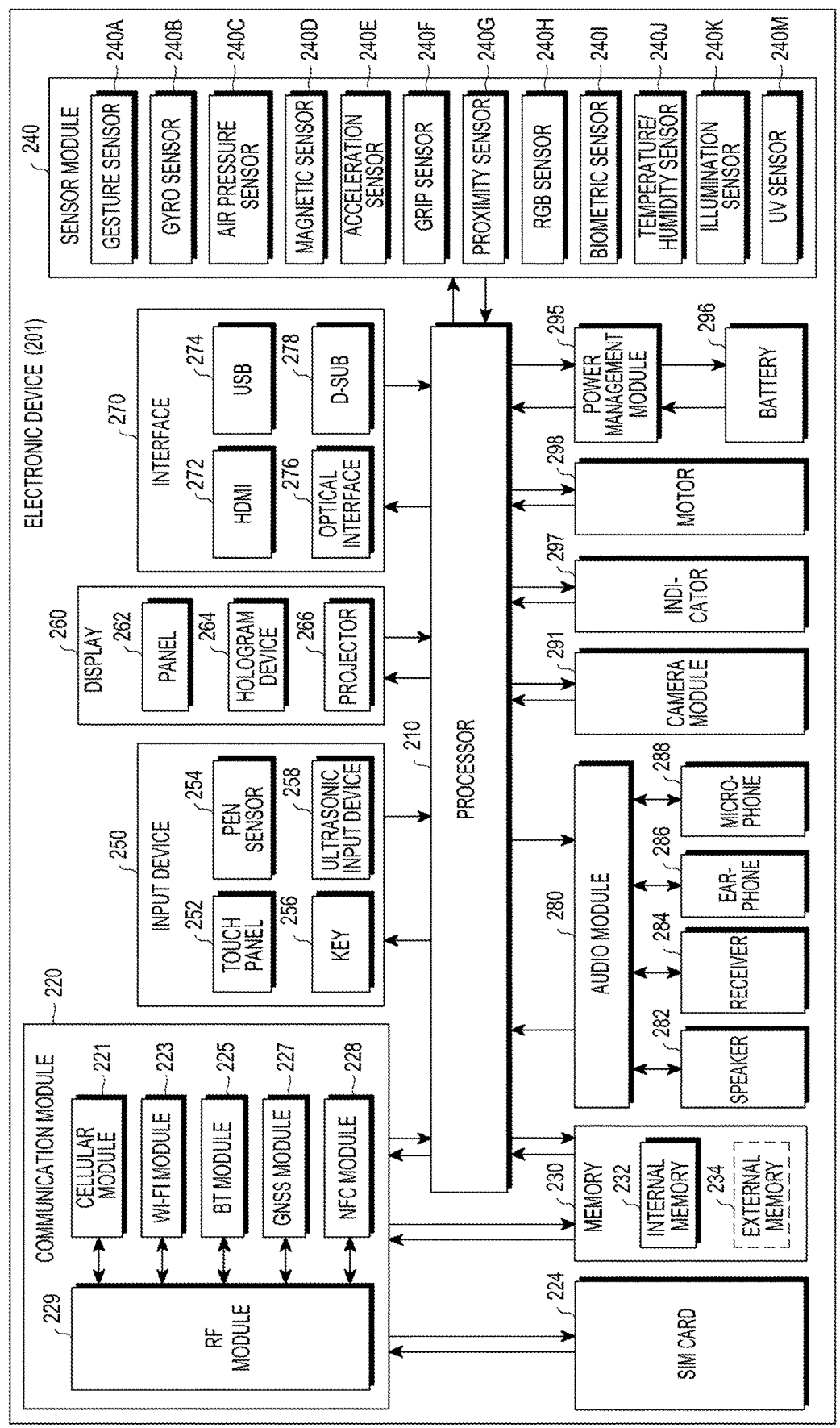
FIG. 2 is a block diagram illustrating an electronic device according to an embodiment of the present disclosure.

FIG. 2 is a block diagram illustrating an electronic device according to an embodiment of the present disclosure.

Referring to FIG. 2, an electronic device 201 may include the whole or part of the configuration of, e.g., the electronic device 101 shown in FIG. 1. The electronic device 201 may include one or more processors (e.g., APs) 210, a communication module 220, a subscriber identification module (SIM) 224, a memory 230, a sensor module 240, an input device 250, a display 260, an interface 270, an audio module 280, a camera module 291, a power management module 295, a battery 296, an indicator 297, and a motor 298. The processor 210 may control multiple hardware and software components connected to the processor 210 by running, e.g., an OS or application programs, and the processor 210 may process and compute various data. The processor 210 may be implemented in, e.g., a system on chip (SoC). According to an embodiment of the present disclosure, the processor 210 may further include a graphical processing unit (GPU) and/or an image signal processor (ISP). The processor 210 may include at least some (e.g., the cellular module 221) of the components shown in FIG. 2. The processor 210 may load a command or data received from at least one of other components (e.g., a non-volatile memory) on a volatile memory, process the command or data, and store resultant data in the non-volatile memory.

The communication module 220 may have the same or similar configuration to the communication interface 170. The communication module 220 may include, e.g., a cellular module 221, a Wi-Fi module 223, a BT module 225, a GNSS module 227, an NFC module 228, and a RF module 229. The cellular module 221 may provide voice call, video call, text, or Internet services through, e.g., a communication network. The cellular module 221 may perform identification or authentication on the electronic device 201 in the communication network using a SIM 224 (e.g., the SIM card). According to an embodiment of the present disclosure, the cellular module 221 may perform at least some of the functions providable by the processor 210. According to an embodiment of the present disclosure, the cellular module 221 may include a CP. According to an embodiment of the present disclosure, at least some (e.g., two or more) of the cellular module 221, the Wi-Fi module 223, the Bluetooth module 225, the GNSS module 227, or the NFC module 228 may be included in a single integrated circuit (IC) or an IC package. The RF module 229 may communicate data, e.g., communication signals (e.g., RF signals). The RF module 229 may include, e.g., a transceiver, a power amp module (PAM), a frequency filter, a low noise amplifier (LNA), or an antenna. According to an embodiment of the present disclosure, at least one of the cellular module 221, the Wi-Fi module 223, the BT module 225, the GNSS module 227, or the NFC module 228 may communicate RF signals through a separate RF module. The subscription identification module 224 may include, e.g., a card including a SIM, or an embedded SIM, and may contain unique identification information (e.g., an integrated circuit card identifier (ICCID) or subscriber information (e.g., an international mobile subscriber identity (IMSI)).

The memory 230 (e.g., the memory 130) may include, e.g., an internal memory 232 or an external memory 234. The internal memory 232 may include at least one of, e.g., a volatile memory (e.g., a dynamic random access memory (DRAM), a static RAM (SRAM), a synchronous dynamic RAM (SDRAM), and the like) or a non-volatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash, or a NOR flash), a hard drive, or solid state drive (SSD). The external memory 234 may include a flash drive, e.g., a compact flash (CF) memory, a secure digital (SD) memory, a micro-SD memory, a min-SD memory, an extreme digital (xD) memory, a multi-media card (MMC), or a memory Stick™. The external memory 234 may be functionally or physically connected with the electronic device 201 via various interfaces.

For example, the sensor module 240 may measure a physical quantity or detect an operational state of the electronic device 201, and the sensor module 240 may convert the measured or detected information into an electrical signal. The sensor module 240 may include at least one of, e.g., a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H (e.g., a red-green-blue (RGB) sensor, a bio sensor 240I, a temperature/humidity sensor 240J, an illumination sensor 240K, or an Ultra Violet (UV) sensor 240M. Additionally or alternatively, the sensing module 240 may include, e.g., an e-nose sensor, an electromyography (EMG) sensor, an electroencephalogram (EEG) sensor, an electrocardiogram (ECG) sensor, an infrared (IR) sensor, an iris sensor, or a finger print sensor. The sensor module 240 may further include a control circuit for controlling at least one or more of the sensors included in the sensing module 240. According to an embodiment of the present disclosure, the electronic device 201 may further include a processor configured to control the sensor module 240 as part of the processor 210 or separately from the processor 210, and the electronic device 2701 may control the sensor module 240 while the processor 210 is in a sleep mode.

The input unit 250 may include, e.g., a touch panel 252, a (digital) pen sensor 254, a key 256, or an ultrasonic input device 258. The touch panel 252 may use at least one of capacitive, resistive, infrared, or ultrasonic methods. The touch panel 252 may further include a control circuit. The touch panel 252 may further include a tactile layer and may provide a user with a tactile reaction. The (digital) pen sensor 254 may include, e.g., a part of a touch panel or a separate sheet for recognition. The key 256 may include e.g., a physical button, optical key or key pad. The ultrasonic input device 258 may detect an ultrasonic wave generated from an input tool through a microphone (e.g., the microphone 288) to identify data corresponding to the detected ultrasonic wave.

The display 260 (e.g., the display 160) may include a panel 262, a hologram device 264, a projector 266, and/or a control circuit for controlling the same. The panel 262 may be implemented to be flexible, transparent, or wearable. The panel 262, together with the touch panel 252, may be configured in one or more modules. According to an embodiment of the present disclosure, the panel 262 may include a pressure sensor (or pose sensor) that may measure the strength of a pressure by the user's touch. The pressure sensor may be implemented in a single body with the touch panel 252 or may be implemented in one or more sensors separate from the touch panel 252. The hologram device 264 may make three dimensional (3D) images (holograms) in the air by using light interference. The projector 266 may display an image by projecting light onto a screen. The screen may be, for example, located inside or outside of the electronic device 201. The interface 270 may include e.g., an HDMI 272, a USB 274, an optical interface 276, or a D-subminiature (D-sub) 278. The interface 270 may be included in e.g., the communication interface 170 shown in FIG. 1. Additionally or alternatively, the interface 270 may include a mobile high-definition link (MHL) interface, a SD card/MMC interface, or infrared data association (IrDA) standard interface.

The audio module 280 may converting, e.g., a sound signal into an electrical signal and vice versa. At least a part of the audio module 280 may be included in e.g., the input/output interface 145 as shown in FIG. 1. The audio module 280 may process sound information input or output through e.g., a speaker 282, a receiver 284, an earphone 286, or a microphone 288. For example, the camera module 291 may be a device for capturing still images and videos, and may include, according to an embodiment of the present disclosure, one or more image sensors (e.g., front and back sensors), a lens, an ISP, or a flash, such as an LED or xenon lamp. The power manager module 295 may manage power of the electronic device 201, for example. According to an embodiment of the present disclosure, the power manager module 295 may include a power management Integrated circuit (PMIC), a charger IC, or a battery or fuel gauge. The PMIC may have a wired and/or wireless recharging scheme. The wireless charging scheme may include e.g., a magnetic resonance scheme, a magnetic induction scheme, or an electromagnetic wave based scheme, and an additional circuit, such as a coil loop, a resonance circuit, a rectifier, or the like may be added for wireless charging. The battery gauge may measure an amount of remaining power of the battery 296, a voltage, a current, or a temperature while the battery 296 is being charged. The battery 296 may include, e.g., a rechargeable battery or a solar battery.

The indicator 297 may indicate a particular state of the electronic device 201 or a part (e.g., the processor 210) of the electronic device, including e.g., a booting state, a message state, or recharging state. The motor 298 may convert an electric signal to a mechanical vibration and may generate a vibrational or haptic effect. The electronic device 201 may include a mobile TV supporting device (e.g., a GPU) that may process media data as per, e.g., digital multimedia broadcasting (DMB), digital video broadcasting (DVB), or mediaFlo™ standards. Each of the aforementioned components of the electronic device may include one or more parts, and a name of the part may vary with a type of the electronic device. According to various embodiments of the present disclosure, the electronic device (e.g., the electronic device 201) may exclude some elements or include more elements, or some of the elements may be combined into a single entity that may perform the same function as by the elements before combined.

Figure 3:
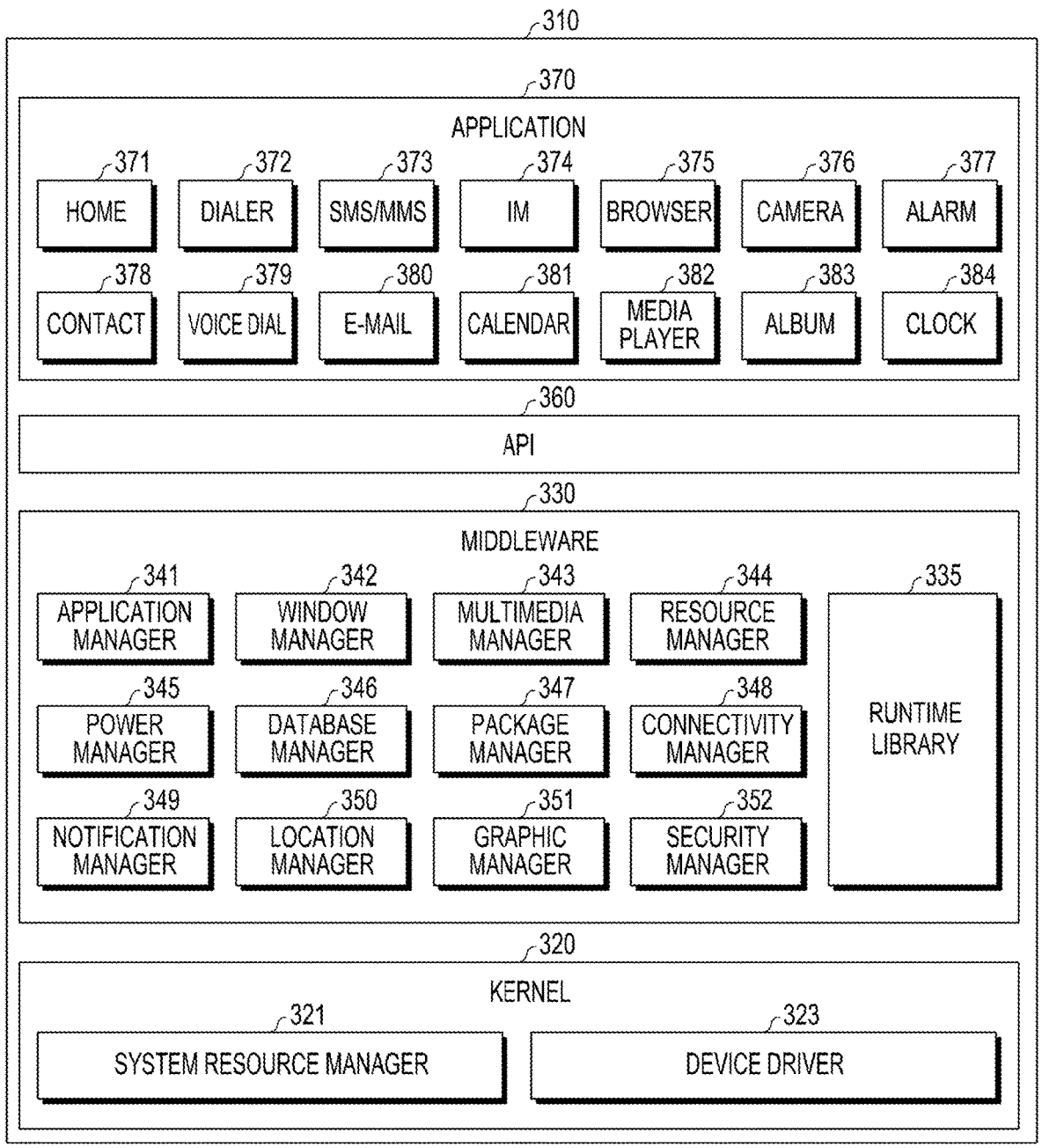
FIG. 3 is a block diagram illustrating a program module according to an embodiment of the present disclosure.

FIG. 3 is a block diagram illustrating a program module according to an embodiment of the present disclosure.

Referring to FIG. 3, according to an embodiment of the present disclosure, a program module 310 (e.g., the program 140) may include an OS controlling resources related to the electronic device (e.g., the electronic device 101) and/or various applications (e.g., the AP 147) driven on the OS. The OS may include, e.g., Android™, iOS™, Windows™, Symbian™, Tizen™, or Bada™.

Referring to FIG. 3, the program module 310 may include a kernel 320 (e.g., the kernel 141), a middleware 330 (e.g., the middleware 143), an API 360 (e.g., the API 145), and/or an application 370 (e.g., the application program 147). At least a part of the program module 310 may be preloaded on the electronic device or may be downloaded from an external electronic device (e.g., the first external electronic device 102 and the second external electronic device 104 or the server 106).

The kernel 320 may include, e.g., a system resource manager 321 or a device driver 323. The system resource manager 321 may perform control, allocation, or recovery of system resources. According to an embodiment of the present disclosure, the system resource manager 321 may include a process managing unit, a memory managing unit, or a file system managing unit. The device driver 323 may include, e.g., a display driver, a camera driver, a Bluetooth driver, a shared memory driver, a USB driver, a keypad driver, a Wi-Fi driver, an audio driver, or an inter-process communication (IPC) driver. The middleware 330 may provide various functions to the application 370 through the API 360 so that the application 370 may use limited system resources in the electronic device or provide functions jointly required by applications 370. According to an embodiment of the present disclosure, the middleware 330 may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, or a security manager 352.

The runtime library 335 may include a library module used by a compiler in order to add a new function through a programming language while, e.g., the application 370 is being executed. The runtime library 335 may perform input/output management, memory management, or arithmetic function processing. The application manager 341 may manage the life cycle of, e.g., the applications 370. The window manager 342 may manage GUI resources used on the screen. The multimedia manager 343 may grasp formats necessary to play media files and use a codec appropriate for a format to perform encoding or decoding on media files. The resource manager 344 may manage the source code or memory space of the application 370. The power manager 345 may manage, e.g., the battery capability or power and provide power information necessary for the operation of the electronic device. According to an embodiment of the present disclosure, the power manager 345 may interwork with a basic input/output system (BIOS). The database manager 346 may generate, search, or vary a database to be used in the applications 370. The package manager 347 may manage installation or update of an application that is distributed in the form of a package file.

The connectivity manager 348 may manage, e.g., wireless connectivity. The notification manager 349 may provide an event, e.g., arrival message, appointment, or proximity alert, to the user. The location manager 350 may manage, e.g., locational information on the electronic device. The graphic manager 351 may manage, e.g., graphic effects to be offered to the user and their related user interface. The security manager 352 may provide system security or user authentication, for example. According to an embodiment of the present disclosure, the middleware 330 may include a telephony manager for managing the voice or video call function of the electronic device or a middleware module able to form a combination of the functions of the above-described elements. According to an embodiment of the present disclosure, the middleware 330 may provide a module specified according to the type of the OS. The middleware 330 may dynamically omit some existing components or add new components. The API 360 may be a set of, e.g., API programming functions and may have different configurations depending on OSs. For example, in the case of Android or iOS, one API set may be provided per platform, and in the case of Tizen, two or more API sets may be offered per platform.

The application 370 may include an application that may provide, e.g., a home 371, a dialer 372, a short messaging system (SMS)/multimedia messaging system (MMS) 373, an instant message (IM) 374, a browser 375, a camera 376, an alarm 377, a contact 378, a voice dial 379, an email 380, a calendar 381, a media player 382, an album 383, or a clock 384, a health-care (e.g., measuring the degree of workout or blood sugar), or provision of environmental information (e.g., provision of air pressure, moisture, or temperature information). According to an embodiment of the present disclosure, the application 370 may include an information exchanging application supporting information exchange between the electronic device and an external electronic device. Examples of the information exchange application may include, but is not limited to, a notification relay application for transferring specific information to the external electronic device, or a device management application for managing the external electronic device. For example, the notification relay application may transfer notification information generated by other application of the electronic device to the external electronic device or receive notification information from the external electronic device and provide the received notification information to the user. For example, the device management application may install, delete, or update a function (e.g., turn-on/turn-off the external electronic device (or some elements) or adjusting the brightness (or resolution) of the display) of the external electronic device communicating with the electronic device or an application operating on the external electronic device. According to an embodiment of the present disclosure, the application 370 may include an application (e.g., a health-care application of a mobile medical device) designated according to an attribute of the external electronic device. According to an embodiment of the present disclosure, the application 370 may include an application received from the external electronic device. At least a portion of the program module 310 may be implemented (e.g., executed) in software, firmware, hardware (e.g., the processor 210), or a combination of at least two or more thereof and may include a module, program, routine, command set, or process for performing one or more functions.

As used herein, the term "module" includes a unit configured in hardware, software, or firmware and may interchangeably be used with other terms, e.g., "logic," "logic block," "part," or "circuit." The module may be a single integral part or a minimum unit or part of performing one or more functions. The module may be implemented mechanically or electronically and may include, e.g., an application-specific integrated circuit (ASIC) chip, field-programmable gate arrays (FPGAs), or programmable logic device, that has been known or to be developed in the future as performing some operations. According to an embodiment of the present disclosure, at least a part of the device (e.g., modules or their functions) or method (e.g., operations) may be implemented as instructions stored in a computer-readable storage medium (e.g., the memory 130), e.g., in the form of a program module. The instructions, when executed by a processor (e.g., the processor 120), may enable the processor to carry out a corresponding function. The computer-readable medium may include, e.g., a hard disk, a floppy disc, a magnetic medium (e.g., magnetic tape), an optical recording medium (e.g., compact disc-ROM (CD-ROM), DVD, magnetic-optical medium (e.g., floptical disk), or an embedded memory. The instruction may include a code created by a compiler or a code executable by an interpreter. Modules or programming modules in accordance with various embodiments of the present disclosure may include at least one or more of the aforementioned components, omit some of them, or further include other additional components. Operations performed by modules, programming modules or other components in accordance with various embodiments of the present disclosure may be carried out sequentially, in parallel, repeatedly or heuristically, or at least some operations may be executed in a different order or omitted or other operations may be added.

Figure 4A:
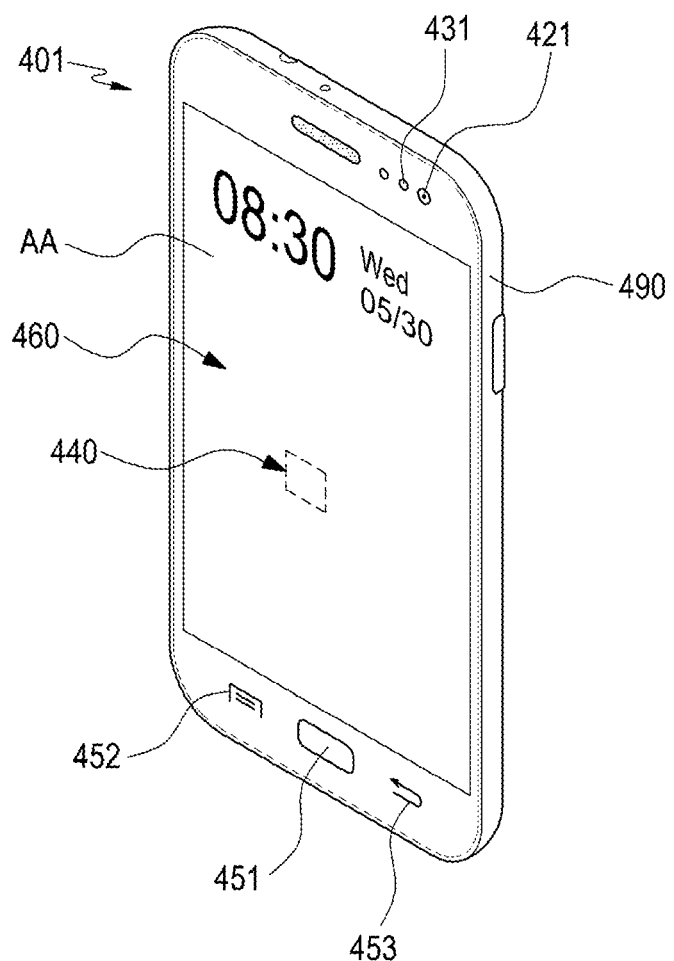
FIG. 4A is a front, perspective view illustrating an electronic device according to an embodiment of the present disclosure.

FIG. 4A is a front, perspective view illustrating an electronic device according to an embodiment of the present disclosure.

Figure 4B:
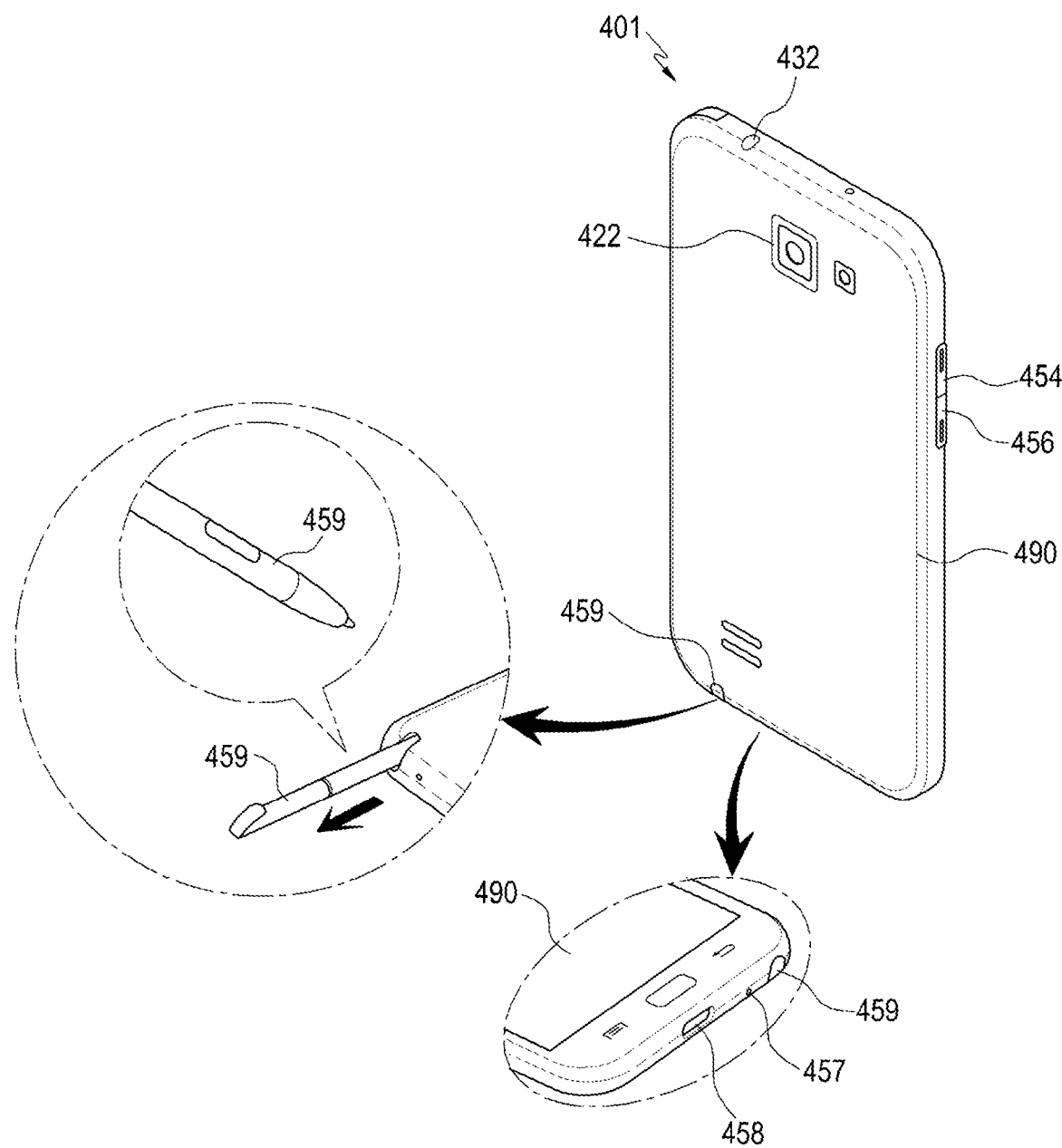
FIG. 4B is a rear, perspective view illustrating an electronic device according to an embodiment of the present disclosure.

FIG. 4B is a rear, perspective view illustrating an electronic device according to an embodiment of the present disclosure.

Figure 4C:
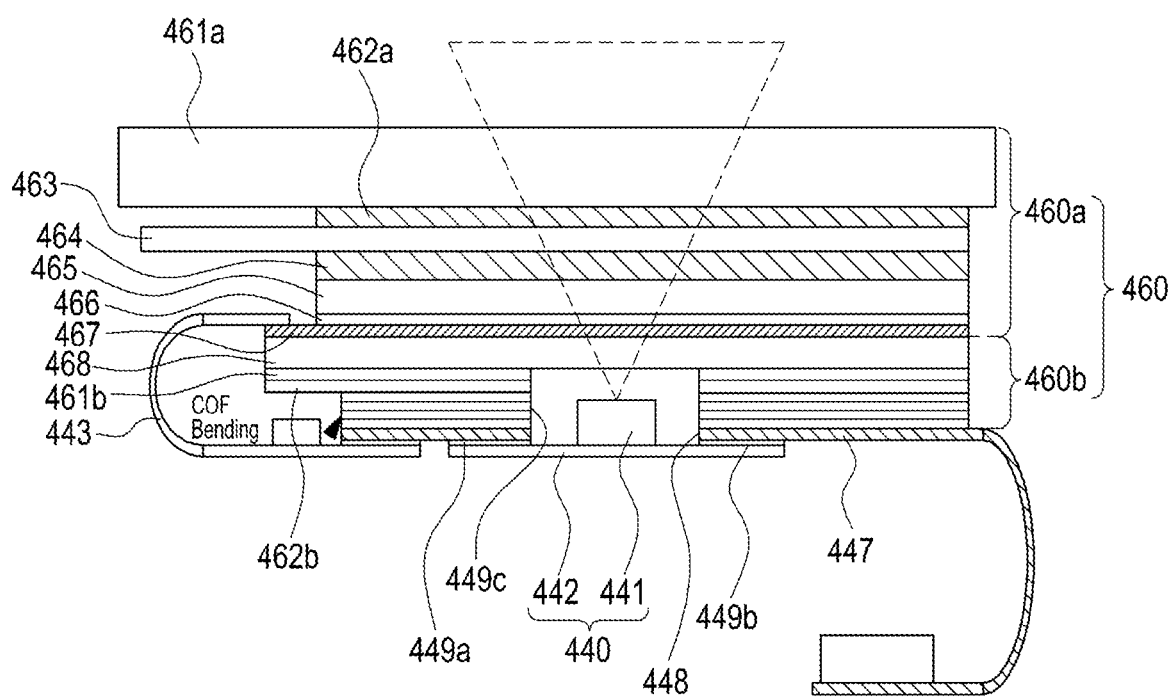
FIG. 4C is a view illustrating a stack in an electronic device according to an embodiment of the present disclosure.

FIG. 4C is a view illustrating a stack in an electronic device according to an embodiment of the present disclosure. An electronic device 401 may be a smartphone or a wearable device. Constitutional parts of the electronic device, such as a smartphone, are described with reference to FIGS. 4A, 4B, and 4C.

According to an embodiment of the present disclosure, the electronic device 401 may include a housing 490, a display 460, a structure having a pass-through opening (hereinafter, referred to as a 'lower panel 460*b*'), and an illuminance sensor area 440.

According to an embodiment of the present disclosure, the housing 490 may include a front surface facing in a first direction, a rear surface facing in a second direction which is an opposite direction of the first direction, and a side surface surrounding at least part of a space between the front surface and the rear surface.

According to an embodiment of the present disclosure, the display 460 may be disposed at the center of the front surface of the housing 490. The display 460 may be large enough to take up a majority of the front surface of the electronic device 401. According to an embodiment of the present disclosure, the display 460 may be a touchscreen. The display 460 may be an active matrix OLED (AMOLED) display.

According to an embodiment of the present disclosure, the display 460 may be a device disposed in the housing 490 and may include a first surface including a display screen exposed through the front surface of the housing 490 and a second surface facing in an opposite direction of the first surface. The front surface of the housing 490 including the display 460 may be partitioned into a screen area AA where a screen from the display 460 is displayed and a non-screen area surrounding the screen area AA. For example, the screen area AA may be an area where a screen is displayed by the display panel 466 and an input or output may be implemented by the touch panel 463. The non-screen area may be an area where signal lines or terminals provided in, e.g., the touch panel 463 or the display panel 466 positioned around the screen area AA are arranged. The non-screen area may be an area blocked by various colors or the housing 490 to prevent the signal lines or terminals from exposure to the outside.

According to an embodiment of the present disclosure, the illuminance sensor area 440 may be disposed in the position of the display 460, e.g., in the screen area AA of the display 460. The illuminance sensor area 440 may be disposed at the side of an opening formed in the lower panel that is disposed under the display 460. The illuminance sensor area 440 is described below.

A home button 451, a menu button 452, and a go-back button 453 may be provided on a lower portion of the display 460. The home button 451 may display a main home screen on the display 460. For example, when the home button 451 is touched while the main home screen and other home screens or menu screen are displayed on the display 460, the main home screen may be displayed on the display 460. The home button 451 may be used to display applications recently used or a task manager on the display 460. The menu button 452 may provide a connectivity menu that may be used on the display 460. The connection menu may include an add widget menu, a change background menu, a search menu, an edit menu, and a setting menu. The go-back button 453 may display the screen displayed immediately before the screen currently in execution or may terminate the latest application used.

A first camera 421 and a proximity sensor 431 may be disposed on an upper portion of the front surface of the electronic device 401. A second camera 422, a flash, and a speaker may be disposed on the rear surface of the electronic device 401.

According to an embodiment of the present disclosure, at least one sensor (e.g., the first camera 421, the second camera 422, or the proximity sensor 431) may form at least part of the housing that forms at least part of an external surface of the electronic device. Further, the sensor (e.g., the illuminance sensor area 440) may be positioned between the display 460*a* and the housing 490.

A connector 458 may be formed on a side surface of a lower end of the electronic device 401 and have an electronic pen 459 inserted thereto. The connector 458 may have multiple electrodes to be wiredly connected with an external device. An earphone connection socket 432 may be formed in a side surface of an upper end of the electronic device 401. A volume up button 454 or a volume down button 456 may be formed in a side surface of the electronic device 401. A microphone 457 may be formed in a side surface of a lower end of the electronic device 401. An earphone may be inserted into the earphone connection socket 432.

According to an embodiment of the present disclosure, the electronic device 401 may be implemented in various forms, e.g., a wrap-around form, a full front display form (e.g., a full front display with no or little bezel), or a transparent device form. However, embodiments of the present disclosure are not limited to a particular type of electronic device 401.

According to an embodiment of the present disclosure, where the electronic device 401 is implemented to have a transparent display or full front display, the color of the display may be varied or adjusted depending on color information about its underneath floor when the electronic device 401 is placed on the underneath floor.

Referring to FIG. 4C, the display 460*a* may be disposed between the second surface of the display 460*a* and the rear surface of the housing 490 and may be structured to include a surface that comes in contact with a significant portion of the second surface of the display 460. As described below, a through opening (hereinafter, referred to as a 'first opening' or 'first or second opening') may be provided as viewed from above the front surface of the housing 490 so that the illuminance sensor area 440 may be disposed in the screen area of the display 460*a*.

According to an embodiment of the present disclosure, the display 460*a* may be provided to display screen and implement an input. According to an embodiment of the present disclosure, the display 460*a* may include a window panel 461*a*, adhesive layers 462*a* and 464, such as optical transparent films (hereinafter, referred to as 'optical transparent films'), a first conductive pattern (hereinafter, referred to as a 'touch panel 463') capable of implementing an input according to a proximity or contact, an OLED layer including a polarizing panel 465 and a display panel 466, and a first polymer layer 467 and a second polymer layer 468.

According to an embodiment of the present disclosure, the window panel 461*a* may be provided on the frontmost surface of the display 460*a* and may be formed of a material, such as transparent glass, to protect the display 460*a*.

According to an embodiment of the present disclosure, the touch panel 463 may be disposed between the OLED layer which is described below and the first surface of the display 460*a*. The touch panel 463 is a component adapted to implement an input according to a contact or proximity to the screen area AA. According to an embodiment of the present disclosure, the touch panel 463 may be implemented in various types, e.g., capacitive, electronic resonance, resistive film, IR or ultrasound type or in a combination thereof. The touch panel 463 may be disposed on an upper surface of the display 460a, specifically between the window panel 461a and the display panel 466.

According to an embodiment of the present disclosure, the optical transparent films 462a and 464 (optically clear adhesive (OCA)) may be provide to join together the window panel 461a and the touch panel 463 and join together the touch panel 463 and the polarizing panel 465. The optical transparent films 462a and 464 may be provided to deliver electrical signals between the polarizing panel 465, the second polymer layer 467, such as a polyimide layer, and the touch panel 463, as well as joining together the touch panel 463 and the polarizing panel 465.

According to an embodiment of the present disclosure, the first polymer layer 467 may form the second surface of the display 460a. The first polymer layer 468 may be provided on a lower surface of the second polymer layer 467. Where the second polymer layer 467 is formed thin, a transparent supporting polymer panel (e.g., a polyethylene terephthalate (PET) panel) may be provided to support and reinforce the second polymer layer 467.

According to an embodiment of the present disclosure, the second polymer layer 467 may be formed of a polyimide film, be a component for supplying power to the display panel 466, and be electrically coupled with a flexible printed circuit board (hereinafter, referred to as a 'first circuit board 447') described below to make a connection with a main circuit board that is mounted inside the housing 490.

The second polymer layer 467 may further include a portion 162b that extends from the part disposed between the first polymer layer 468 and the first surface of the display 460a and is bent in the second direction.

According to an embodiment of the present disclosure, the portion 443 may be subjected to chip-on-film (COF) bending and polyimide (PI) bending depending on the structure in which it is joined and connected as described below.

The OLED layers 465 and 466 may contact the second polymer layer 467 and may be disposed between the second polymer layer 467 and the first surface of the display 460a. The OLED layers 465 and 466 may include the polarizing panel 465 and the display panel 466. The polarizing panel 465 may be layered on the lower surface of the optical transparent film 464. The polarizing panel 465 may be provided to increase the screen quality of the polarizing panel 466 as described below and enhance outdoor visibility.

According to an embodiment of the present disclosure, although an example is described in which the layer for displaying screen is an AMOLED layer, embodiments of the present disclosure are not limited thereto. For example, various changes or modifications may be made thereto, such as an LCD or LED layer.

As described above, in the display 460a of the present disclosure, the window panel 461a, the optical transparent film 462a, the touch panel 463, the optical transparent film 464, the OLED layers 465 and 466, the second polymer layer 467, and the first polymer layer 468 may sequentially be layered from the first surface of the display and the second surface of the display.

A second conductive pattern separate from the touch panel may be provided between the first polymer layer 468 and the second polymer layer 467.

According to an embodiment of the present disclosure, the lower panel 460b may be layered on the lower surface of the display 460a to support the display 460a and be provided to prevent, e.g., internal modules, from being viewed through the display. The lower panel 460b may have a first opening 449c allowing the illuminance sensor area 440 described below to be seated at a predetermined position in the screen area AA of the display 460a.

The lower panel 460b may be a structure that is layered on the lower surface of the second surface of the display 460a and may include various panels. The lower panel 460b may include flexible layers 461b and 462b and a short-range communication module.

The lower panel 460b may have a first adhesive layer to contact the second surface of the display 460a.

According to an embodiment of the present disclosure, the flexible layers 461b and 462b may be brought in contact with the first adhesive layer and may be disposed between the first adhesive layer and the second surface of the housing 490.

According to an embodiment of the present disclosure, the flexible layers 461b and 462b may include an EMBO panel 461b and a sponge panel 462b.

The EMBO panel 461b may be formed of an opaque substance and be used to prevent the inside from being viewed through the display 460a. The EMBO panel 461b may present a dark color. The EMBO panel 461, together with the first polymer layer 468 provided to support or reinforce the second polymer layer 467, may serve as a support.

According to an embodiment of the present disclosure, the sponge panel 462b may be provided to mitigate and/or prevent the display 460a from floating or sinking due to a foreign body that may arise upon assembly of the display 460a.

According to an embodiment of the present disclosure, the first circuit board 447 may be disposed on the lower surface of the lower panel 460b. The first circuit board 447 may include a portion disposed between the flexible layers 461b and 462b and the second surface of the housing 490. The first circuit board 447 may include another portion that extends from the portion and bends in the second direction to make a connection with the main circuit board.

The above-described display 460a and the lower panel 460b need to be electrically connected with the first circuit board 447. The display 460a (e.g., the first polymer layer 468) and the first circuit board 447 may be electrically connected through COF bending. Or, the display 460a (e.g., the first polymer layer 468) and the first circuit board 447 may be electrically connected through PI bending.

According to an embodiment of the present disclosure, the lower panel 460b may have a first opening 449c allowing the illuminance sensor area 440 to be provided at a predetermined position corresponding to the screen area AA.

According to an embodiment of the present disclosure, the lower panel 460b, unlike the upper panel 460a, may be formed of an opaque substance to prevent the internal components of the display 460a from being viewed. Accordingly, the illuminance sensor 441 may be disposed in the lower panel 460b, and the first opening 449c may be provided to allow external ambient light to come into the illuminance sensor 441. Specifically, according to an embodiment of the present disclosure, as the display 460a is formed of a transparent material allowing a screen generated from the display panel 466 to be displayed, external ambient light may be introduced up into the upper panel 460a and the second polymer layer 467. However, the first opening 449c is formed in the lower panel 460b which is provided to prevent the internal structure from being viewed, allowing the illuminance sensor 441 described below to be mounted corresponding to the screen area AA and enabling external ambient light to reach the illuminance sensor 441.

According to an embodiment of the present disclosure, as set forth above, the illuminance sensor area 440 may be disposed at a predetermined position of the screen area AA of the display 460a, and to that end, it may be mounted at the position of the first and second openings 449c and 448 which are formed on the screen area AA of the display 460a.

According to an embodiment of the present disclosure, the illuminance sensor area 440 may include the second circuit board 442 and the illuminance sensor 441.

The second circuit board 442 may be layered on the lower surface of the first circuit board 447 and may be provided to cover the second opening 448 corresponding to where the second opening 448 is formed. The second circuit board 442 may be electrically connected with the first circuit board 447 to deliver a signal from the illuminance sensor 441 to the first circuit board 447. The illuminance sensor 441 and a coupling member 449a described below may be provided on a surface of the second circuit board 442.

The illuminance sensor 441 may be electrically mounted on an upper part of the second circuit board 442. When the second circuit board 442 is layered to fit the second opening 448 of the first circuit board 447, the illuminance sensor 441 may be seated inside the first and second openings. The illuminance sensor 441 may detect external ambient light that comes from the outside of the display 460a through the first and second openings.

The coupling member 449a may be provided at a predetermined position around the illuminance sensor 441, allowing the second circuit board 442 to be attached to the first circuit board 447. The coupling member 449a may be formed of a conductive double-sided tape or a non-conductive double-sided tape.

The connection terminal 440b may be provided at a position different from the position of the coupling member 449a around the illuminance sensor 441 and may be provided at a position corresponding to the terminal part of the first circuit board 447 to be electrically connected with the terminal part of the first circuit board 447 when the second circuit board 447 is coupled with the first circuit board 447. As described above, the terminal part and the connection terminal 449b may be joined together through a thermal fusion scheme.

According to an embodiment of the present disclosure, described above is an example in which the illuminance sensor area 440 is mounted on the first circuit board 447 having the second opening 448 so that the illuminance sensor 441 is connected with the first opening 449c while being mounted on the second circuit board 447. Thus, the first circuit board 447 may be further reinforced by the coupling of the second circuit board 442. When the illuminance sensor area 440 is broken or damaged, the second circuit board 442 alone may be separated from the lower surface of the first circuit board 447, enabling easier replacement of the illuminance sensor area 440, and resultantly, easier management in the future.

In the electronic device 401 configured as described above, the illuminance sensor area 440 may be disposed at a predetermined position of the screen area AA of the display 460a, e.g., at the center of the screen area AA (refer to FIG. 4A). According to an embodiment of the present disclosure, although an example is described in which the illuminance sensor area 440 is positioned at the center of the screen area AA, embodiments of the present disclosure are not limited thereto, and the illuminance sensor area 440 may rather be positioned anywhere in the screen area AA.

External ambient light may be transmitted through the transparent window panel 461a, the touch panel 463, and the display panel 466 to the first and second openings and the illuminance sensor 441 which is mounted inside the first and second openings. The illuminance sensor 441 mounted on the screen area AA of the display 460a may detect the received ambient light, allowing the brightness of the display 460a to be adjusted depending on the external brightness through the detected value.

Figure 5:
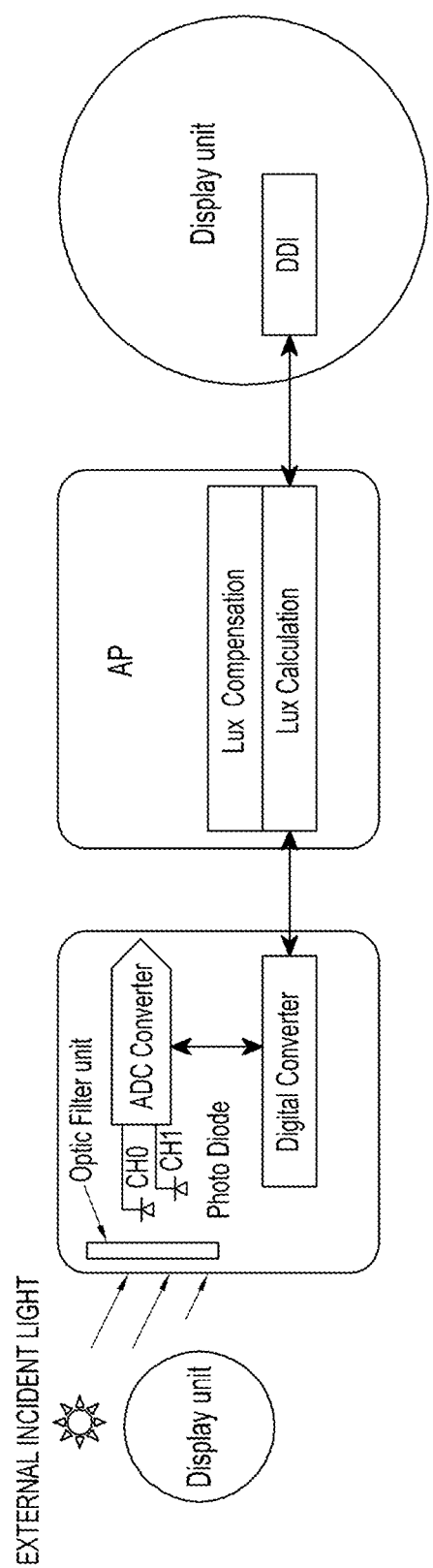
FIG. 5 is a view illustrating driving of an illuminance sensor mounted under a display in an electronic device according to an embodiment of the present disclosure.

FIG. 5 is a view illustrating driving of an illuminance sensor mounted under a display in an electronic device according to an embodiment of the present disclosure.

Referring to FIG. 5, according to an embodiment of the present disclosure, the illuminance sensor may be mounted under the screen area of the display to detect external ambient light that passes through the display. The external ambient light may be filtered through an illuminance sensor filter of the illuminance sensor. A light receiving part (e.g., a photo diode) of the illuminance sensor may convert filtered data into an electrical signal. An analog level of electrical signal converted by the light receiving part may be converted into a digital level of electrical signal through a signal converting module (e.g., an analog-digital converter (ADC)).

According to an embodiment of the present disclosure, light emitted from the display may interfere with obtaining the whole external ambient light that comes into the illuminance sensor. Thus, there is a need for technology to minimize the influence by the light emission from the display.

According to an embodiment of the present disclosure, the actual outside illuminance may be detected through the digital level value (or digital level data) of ambient light converted by the illuminance sensor, and the brightness of the display may automatically be adjusted by the detected value.

According to an embodiment of the present disclosure, the illuminance sensor may be positioned on the lower panel at the rear surface of the display to be disposed in the screen area of the display in which case an error may occur due to the light emission from the display under a low-illuminance environment. Where a display driver integrated circuit (DDI) is able to both transmit and receive signals and to interpret pixel information, the outside illuminance may be determined by subtracting error data occurring upon light emission of the display from information about the ambient light obtained from the illuminance sensor through information (e.g., a brightness value) provided from the DDI and may be delivered to the display. In other words, the actual brightness of the display may be compensated by reflecting the light generated from the display of the electronic device.

Figure 6:
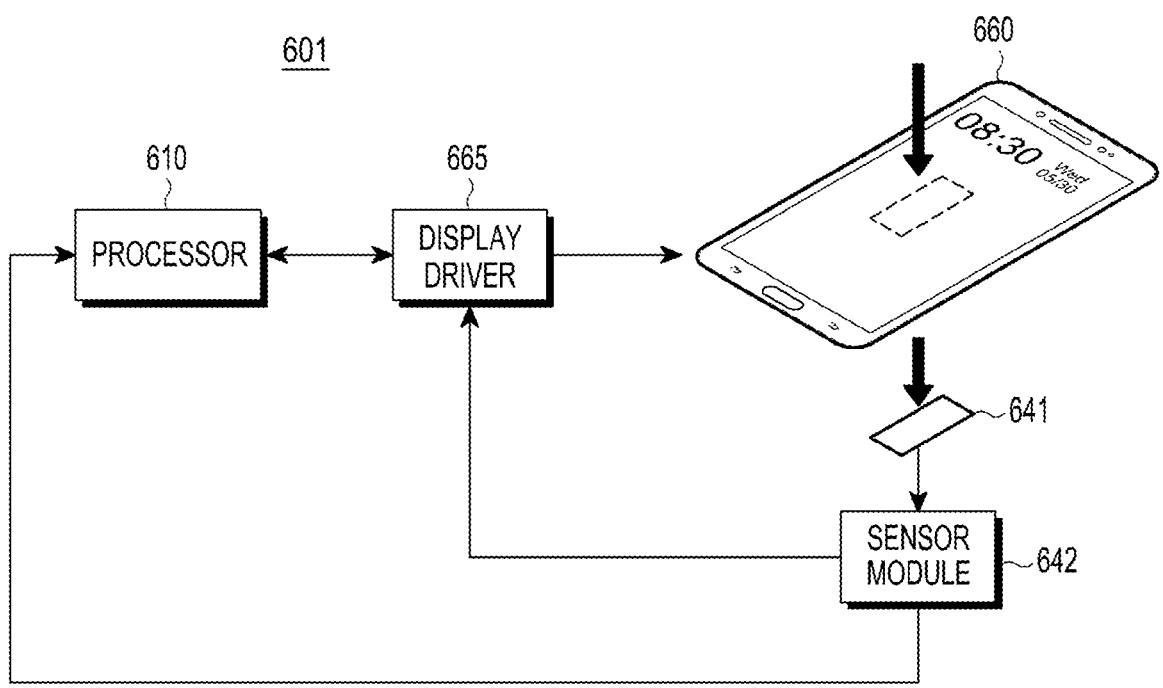
FIG. 6 is a block diagram illustrating a configuration of an electronic device according to an embodiment of the present disclosure.

FIG. 6 is a block diagram illustrating a configuration of an electronic device according to an embodiment of the present disclosure.

Referring to FIG. 6, according to an embodiment of the present disclosure, an electronic device 601 may include the whole or part of, e.g., the electronic device 101 of FIG. 1 and the electronic device 201 of FIG. 2. The electronic device 601 may include a processor 610, a display 660, an illuminance sensor 641, a sensor module 642, and a display driver 665.

According to an embodiment of the present disclosure, the display 660 may include the whole or part of the display 160 of FIG. 1 and the display 260 of FIG. 2. The display 660 may include a display screen exposed through the front surface of the electronic device 601. The display 660 may display an image according to a brightness setting that has at least one brightness value. The brightness setting may be divided into grades preset to have different brightness values. For example, the brightness setting may be divided into five grades, and an image may be displayed on the display at a different brightness value depending on each grade. According to an embodiment of the present disclosure, the display 660 may include an AMOLED display.

According to an embodiment of the present disclosure, the illuminance sensor 641 may be mounted under the display 660 and detect light received through the display 660. The illuminance sensor 641 may be disposed at a predetermined position of the screen area of the display 660, e.g., at the center of the screen area. The illuminance sensor 641 may be a sensor capable of detecting a value related to, e.g., brightness, but is not limited to a particular type of sensor. For example, the illuminance sensor 641 according to an embodiment of the present disclosure may include any types of sensors capable of detecting and determining an illuminance related to the brightness.

According to an embodiment of the present disclosure, the sensor module 642 may function as an assistant processor capable of detecting data obtained by the illuminance sensor 641. The sensor module 642 may control the illuminance sensor 641b to obtain detection data and transmit the obtained detection data to the processor 610b.

According to an embodiment of the present disclosure, the display driver 665 may adjust the red (R)/green (G)/blue (B) pixels included in the display 660 under the control of the processor 610. The display driver 665 may include a display DDI. The display driver 665 may enable the attributes of the display 660 to be adjusted. The attributes of the display 660 may include brightness values or gamma values.

According to an embodiment of the present disclosure, the processor 610 may include the whole or part of the processor 120 of FIG. 1 and the processor 210 of FIG. 2. The processor 610 may process at least part of information obtained from other components (e.g., the display 660, the illuminance sensor 641, or the display driver 665) of the electronic device 601 and provide the processed information to the user in various manners. The processor 610 may control all of the components of the electronic device 601.

According to an embodiment of the present disclosure, the processor 610 may determine the illuminance of the outside of the electronic device 601 using detection data obtained by the illuminance sensor 641 and relevant information between the display 660 and the illuminance sensor 641 while the display 660 displays an image.

According to an embodiment of the present disclosure, the processor 610 may control the display 660 according to a brightness setting having at least one brightness value.

According to an embodiment of the present disclosure, the processor 610 may use first detection data obtained by the illuminance sensor 641 while displaying a first image on the display 660 set in a first brightness setting and the brightness value of the first brightness setting to obtain detection data related to the display 660 set in at least one brightness setting having a brightness value different from the first brightness setting. The processor 610 may obtain relevant information including, at least, detection data related to the display 660 according to each brightness setting. The processor 610 may control the display 660 to be set in the first brightness setting and display a first image on the display 660 set in the first brightness setting. The processor 610 may obtain detection data by the illuminance sensor 641 while the display 660 displays the first image in the first brightness setting. The processor 610 may obtain detection data related to the display 660 set in a brightness setting having a different brightness value from the first brightness setting using the brightness value according to the first brightness setting of the display 660 and the obtained detection data. The processor 610 may calculate a ratio of the obtained detection data to the brightness value of the first brightness setting and apply the brightness value of each brightness setting to the calculated ratio, automatically producing detection data under a different brightness setting condition. The first brightness setting may be set to a grade having the maximum brightness value among a plurality of preset brightness setting grades. Further, the first image may be an image where the ratio representing the brightness of image exhibits the maximum value.

According to an embodiment of the present disclosure, the processor 610 may compile detection data related to the display according to each brightness setting, configuring a lookup table. The configured lookup table may be used to remove brightness influences by the display from the illuminance value of the external ambient light upon measuring the illuminance value by the external ambient light using the illuminance sensor.

According to an embodiment of the present disclosure, the processor 610 may calibrate the detection data value of the lookup table according to the ratio that represents the brightness of the image displayed on the display 660 and determine the outside illuminance using the calibrated detection data.

According to an embodiment of the present disclosure, the processor 610 may adjust the attribute of the display 660 using first detection data obtained by the illuminance sensor 641 when a first image is displayed on the display 660 and second detection data obtained by the illuminance sensor 641 when a second image is displayed on the display 660. The first image and the second image may be images from which different pieces of detection data may be obtained when displayed on the display 660 under the same condition. In addition, the first image and the second image may be images that may have different ratios that represents the brightness of image. For example, the first image may be an image whose image brightness ratio is the maximum value, 100%, and the second image may be an image whose image brightness ratio is the minimum value, 0%.

According to an embodiment of the present disclosure, the processor 610 may obtain a difference value between first detection data obtained by the illuminance sensor 641 when a first image is displayed on the display 660 and second detection data obtained by the illuminance sensor 641 when a second image is displayed on the display 660, and when a difference occurs as compared with a prior difference value obtained under the same condition, the processor 610 may adjust the attribute of the display 660. The processor 610 may adjust the attribute of the display 660 so that the obtained difference value corresponds to the prior difference value. The processor 610 may control the display driver 665 to adjust the attribute of the display 660, thereby adjusting the brightness value or gamma value of the display 660.

Figure 7:
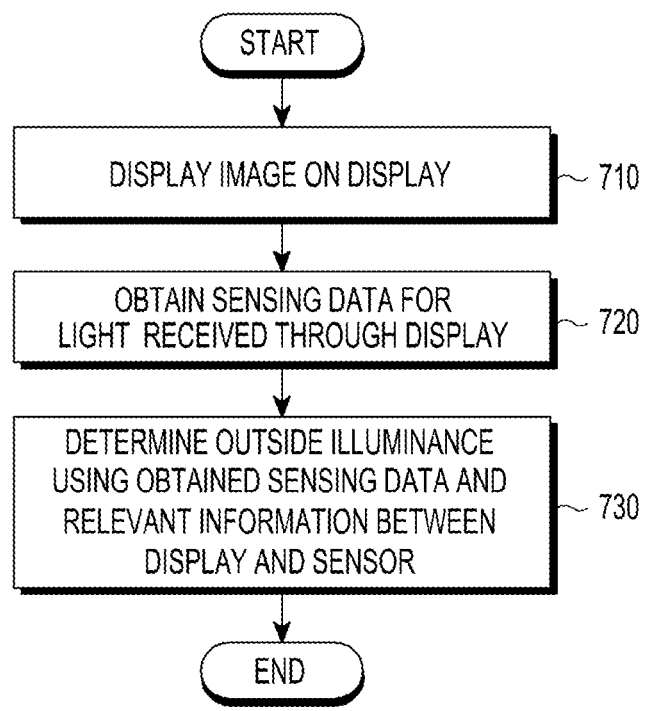
FIG. 7 is a flowchart illustrating a process for determining an outside illuminance in an electronic device according to an embodiment of the present disclosure.

FIG. 7 is a flowchart illustrating a process for determining an outside illuminance in an electronic device according to an embodiment of the present disclosure.

Referring to FIG. 7, in operation 710, an electronic device (e.g., the processor 610) may display an image through a display (e.g., the display 660) provided on the front surface of the electronic device.

In operation 720, the electronic device may obtain detection data for light received through the display using a sensor (e.g., the illuminance sensor 641) that is mounted under the display inside the electronic device and detects light received through the display.

In operation 730, the electronic device may determine the illuminance of the outside of the electronic device using relevant information (e.g., a lookup table) between the display and the sensor which is previously stored and the obtained detection data.

Figure 8:
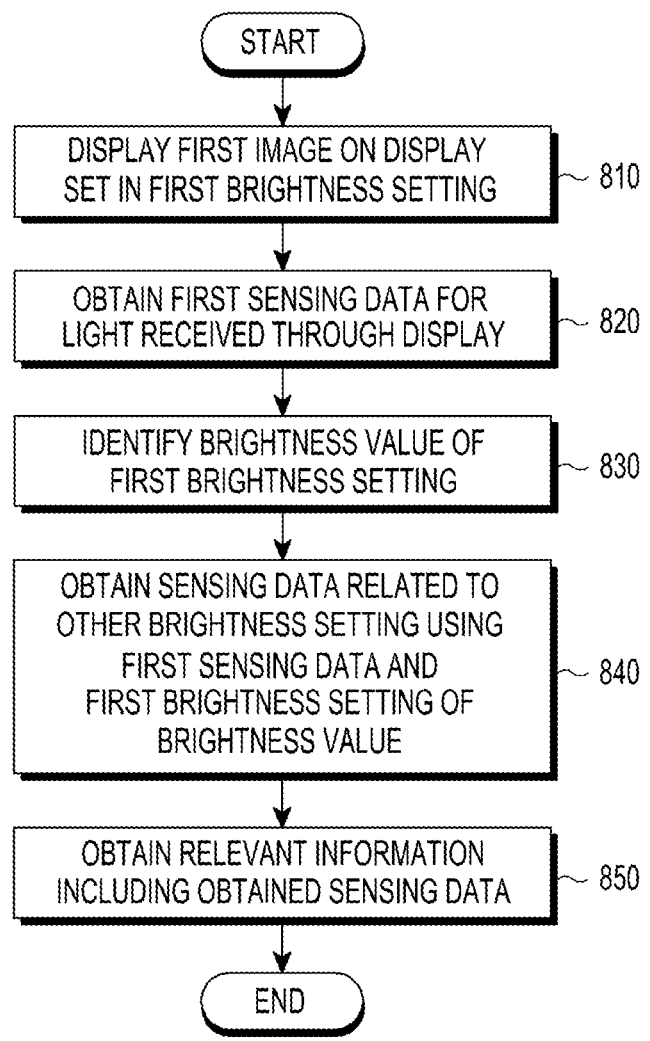
FIG. 8 is a flowchart illustrating a process for obtaining relevant information between a display and a sensor in an electronic device according to an embodiment of the present disclosure.

FIG. 8 is a flowchart illustrating a process for obtaining relevant information between a display and a sensor in an electronic device according to an embodiment of the present disclosure.

Figure 9:
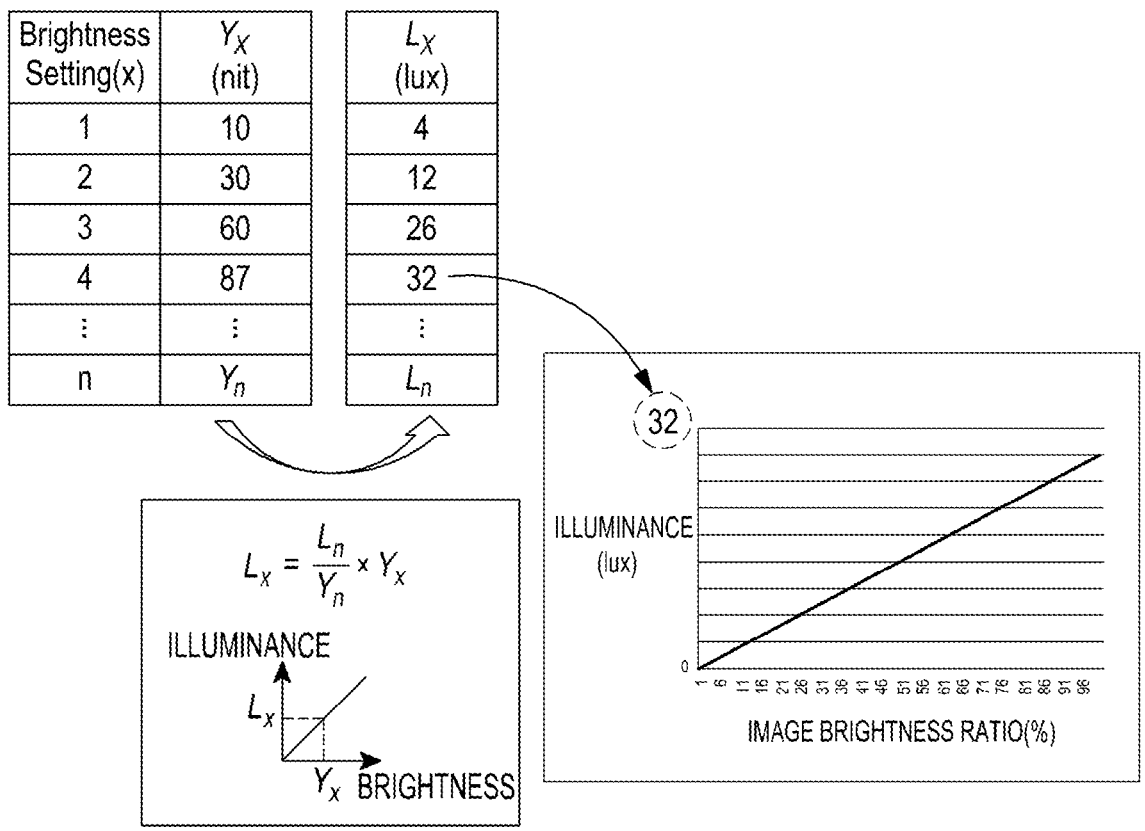
FIG. 9 is a view illustrating a method for obtaining relevant information between a display and a sensor in an electronic device according to an embodiment of the present disclosure.

FIG. 9 is a view illustrating a method for obtaining relevant information between a display and a sensor in an electronic device according to an embodiment of the present disclosure.

Referring to FIG. 8, in operation 810, an electronic device (e.g., the processor 610) may display a first image on a display (e.g., the display 660) set in a first brightness setting. The brightness setting of the display may be divided into grades preset to have different brightness values. For example, the brightness setting may be divided into five grades, and an image may be displayed on the display at a different brightness value depending on each grade. Further, the first image may be an image where the ratio representing the brightness of image exhibits the maximum value.

In operation 820, the electronic device may obtain first detection data for light received through the display using a sensor (e.g., the illuminance sensor 641).

In operation 830, the electronic device may identify a brightness value according to the first brightness setting.

In operation 840, the electronic device may obtain detection data related to a different brightness setting using the first brightness setting of brightness value and the first detection data.

In operation 850, the electronic device may obtain relevant information (e.g., a lookup table) including the obtained detection data.

Referring to FIG. 9, the method for obtaining the relevant information between the display and the sensor in operation 850 may first select a first brightness setting of the display. In the first brightness setting, a grade presenting a highest brightness value may be selected from among each brightness setting. A first image to be displayed on the display may be selected. The first image selected may be an image whose brightness ratio is the maximum. For example, the first image may be an image in which the R/G/B subpixels (255, 255, 255) are in a full white pattern. Or, the first image may be an image in which the R/G/B subpixels are in any one of a full red pattern (255, 0, 0), a full green pattern (0, 255, 0), and a full blue pattern (0, 0, 255). Thus, illuminance detection data may be adapted to be obtained per R/G/B subpixel, thereby enabling data for calibration of each R/G/B subpixel to be obtained.

When the first brightness setting and the first image are selected, the display may be set in the first brightness setting, and the first image may be displayed on the display set in the first brightness setting. While the first image is displayed on the display set in the first brightness setting, the illuminance sensor may be used to obtain detection data. For example, a ratio of the obtained detection data to the first brightness setting of brightness value may be calculated using the equation of FIG. 9, and each brightness grade of brightness value may be applied to obtain detection data that is estimated upon displaying the first image on the display in the corresponding brightness grade.

Each piece of detection data for each brightness setting may be compiled, configuring a lookup table as relevant information between the display and the sensor.

The detection data values of the lookup table may be calibrated according to the brightness ratio of the image displayed on the display using the condition that linearly influences the image brightness ratio and brightness value, so that detection data may be calculated even under the context where the display displays an image having a different brightness ratio than that of the image used to calculate the lookup table.

Figure 10:
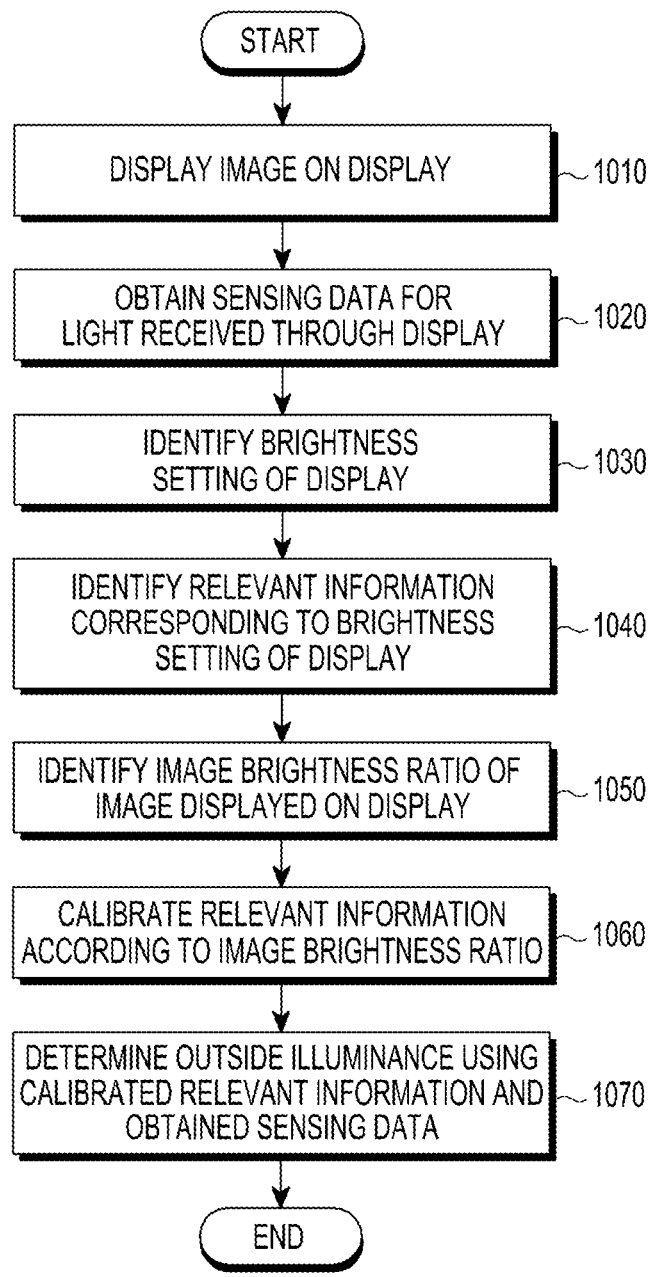
FIG. 10 is a flowchart illustrating a process for determining an outside illuminance in an electronic device according to an embodiment of the present disclosure.

FIG. 10 is a flowchart illustrating a process for determining an outside illuminance in an electronic device according to an embodiment of the present disclosure.

Referring to FIG. 10, in operation 1010, an electronic device (e.g., the processor 610) may display an image on a display (e.g., the display 661).

In operation 1020, the electronic device may obtain detection data for light received through the display using a sensor (e.g., the illuminance sensor 641).

In operation 1030, the electronic device may identify the brightness setting of the display and obtain a brightness value of the brightness setting.

In operation 1040, the electronic device may identify relevant information between the display and the sensor corresponding to the brightness setting of the display.

In operation 1050, the electronic device may identify an image brightness ratio for the image displayed on the display.

In operation 1060, the electronic device may calibrate the relevant information corresponding to the brightness setting of the display according to the brightness ratio of the image displayed on the display.

In operation 1070, the electronic device may determine ambient illuminance using the calibrated relevant information and the obtained detection data.

Figure 11:
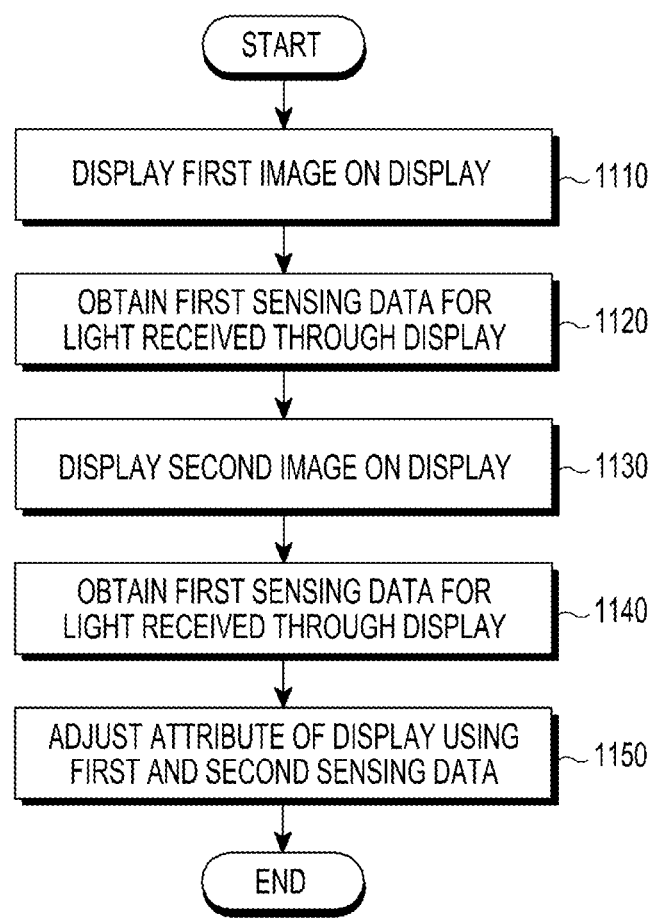
FIG. 11 is a flowchart illustrating a process for adjusting an attribute of a display in an electronic device according to an embodiment of the present disclosure.

FIG. 11 is a flowchart illustrating a process for adjusting an attribute of a display in an electronic device according to an embodiment of the present disclosure.

Referring to FIG. 11, in operation 1110, an electronic device (e.g., the processor 610) may display a first image on a display (e.g., the display 661).

In operation 1120, the electronic device may obtain first detection data for light received through the display using a sensor (e.g., the illuminance sensor 641).

In operation 1130, the electronic device may display a second image on the display.

In operation 1140, the electronic device may obtain second detection data for light received through the display using a sensor.

In operation 1150, the electronic device may adjust the attribute of the display using the first detection data and the second detection data. The attribute of the display may include a brightness value or a gamma value.

Figure 12:
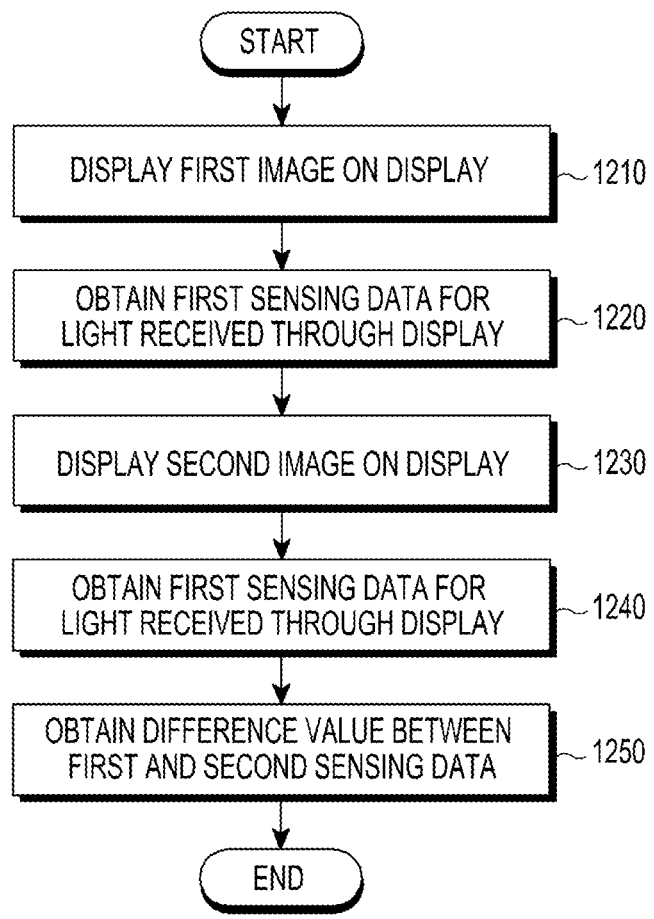
FIG. 12 is a flowchart illustrating a process for obtaining a difference value for an image displayed on a display in an electronic device according to an embodiment of the present disclosure.

FIG. 12 is a flowchart illustrating a process for obtaining a difference value for an image displayed on a display in an electronic device according to an embodiment of the present disclosure.

Figure 13:
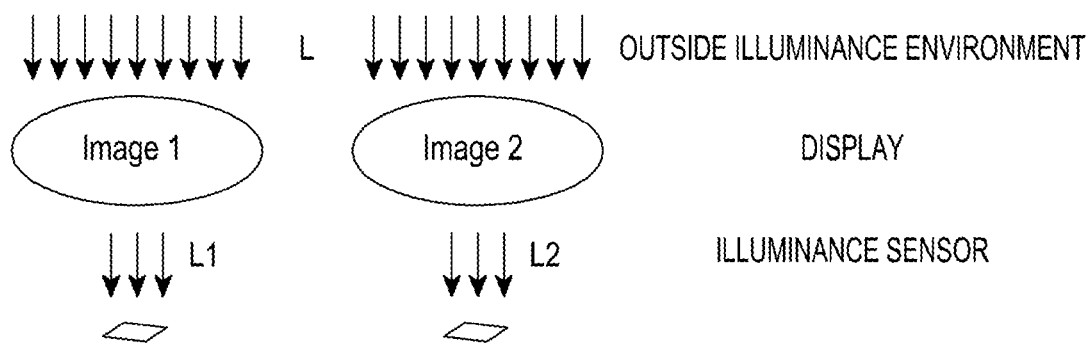
FIG. 13 is a view illustrating a method for obtaining a difference value for an image displayed on a display in an electronic device according to an embodiment of the present disclosure.

FIG. 13 is a view illustrating a method for obtaining a difference value for an image displayed on a display in an electronic device according to an embodiment of the present disclosure.

Referring to FIGS. 12 and 13, in operation 1210, an electronic device (e.g., the processor 610) may display a first image on a display (e.g., the display 661).

In operation 1220, the electronic device may obtain first detection data for light received through the display using a sensor (e.g., the illuminance sensor 641). At this time, as the first detection data, detection data in which external ambient light L is mixed with light L1 by the first image of the display may be obtained. The first image may be an image that has a minimum image brightness ratio. For example, the first image may be an image in which the R/G/B subpixels (0, 0, 0) are in a full black pattern.

In operation 1230, the electronic device may display a second image on the display.

In operation 1240, the electronic device may obtain second detection data for light received through the display using a sensor. At this time, as the second detection data, detection data in which the external ambient light L is mixed with light L2 by the second image of the display may be obtained. The second image may be an image that has a maximum image brightness ratio. For example, the second image may be an image in which the R/G/B subpixels (255, 255, 255) are in a full white pattern. Or, the second image may be an image in which the R/G/B subpixels are in any one of a full red pattern (255, 0, 0), a full green pattern (0, 255, 0), and a full blue pattern (0, 0, 255). Thus, illuminance detection data may be adapted to be obtained per R/G/B subpixel, thereby enabling data for calibration of each R/G/B subpixel to be obtained.

In operation 1250, the electronic device may obtain a difference value between the first detection data and the second detection data. The electronic device may store and manage the obtained difference value.

Figure 14:
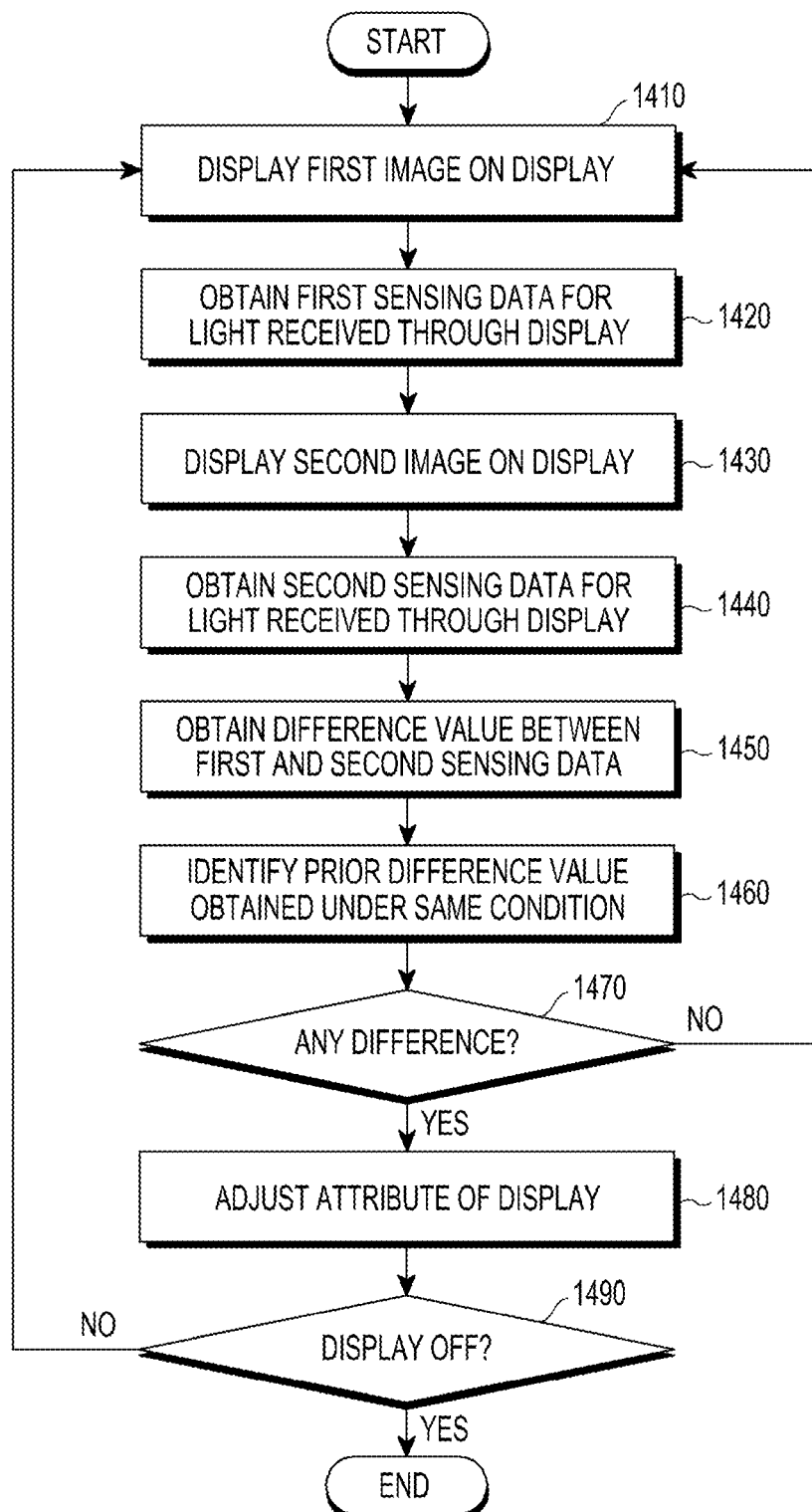
FIG. 14 is a flowchart illustrating a process for adjusting an attribute of a display in an electronic device according to an embodiment of the present disclosure.

FIG. 14 is a flowchart illustrating a process for adjusting an attribute of a display in an electronic device according to an embodiment of the present disclosure.

Referring to FIG. 14, in operation 1410, an electronic device (e.g., the processor 410) may display a first image on a display (e.g., the display 661).

In operation 1420, the electronic device may obtain first detection data for light received through the display that displays the first image.

In operation 1430, the electronic device may display a second image on the display.

In operation 1440, the electronic device may obtain second detection data for light received through the display that displays the second image.

In operation 1450, the electronic device may obtain a difference value between the first detection data and the second detection data.

In operation 1460, the electronic device may identify a difference value obtained under the same condition as the condition for obtaining the first and second detection data.

In operation 1470, the electronic device may compare the difference value obtained at the current time with a prior difference value obtained to determine whether there is a difference. Absent from a difference, the electronic device may return the process to operation 1410.

Unless there is a difference in difference value in operation 1470, the electronic device may adjust the attribute of the display so that the difference value corresponds to the prior difference value in operation 1480.

In operation 1490, the electronic device may go back to operation 1410 to perform the process while the display does not turn off.

As is apparent from the foregoing description, according to an embodiment of the present disclosure, there are provided an electronic device having a display and a sensor and a method for operating the same. The illuminance sensor may be mounted in the screen area of the display, allowing for more degrees of freedom in mounting and designing the illuminance sensor. Relevant information between the display and the illuminance sensor may be put to use to minimize influence by light emission from the display, presenting an exact illuminance. A deterioration of the display may be detected and compensated using detection data acquired by the illuminance sensor upon displaying an image on the display.

While the present disclosure has been shown and described with reference to various embodiments thereof it will be understood by those skilled in the art that various changes in form or details may be made therein without departing from the spirit and scope of the present disclosure defined by the appended claims and their equivalents.

What is claimed is:

1. An electronic device comprising:
a housing;
a display disposed on a surface of the housing;
a sensor mounted under the display inside the housing to sense light received through the display and light received from the display; and
a processor electrically connected with the display and the sensor,
wherein the processor is configured to:
obtain sensing data from the sensor while an image is displayed on the display,
identify a first brightness setting value of the display,
identify an image brightness ratio for the image currently displayed on the display,
identify an illuminance of outside of the housing based on the obtained sensing data from the sensor and compensation value, the compensation value corresponding to the identified first brightness setting value of the display and the identified image brightness ratio of the image among a pre-stored plurality of compensation values, and
set a brightness setting of the display to a second brightness setting value determined based at least on the identified illuminance of outside of the housing.

2. The electronic device of claim 1, wherein the display comprises an active matrix organic light emitting diode (AMOLED) display.

3. The electronic device of claim 1, wherein the sensor comprises an illuminance sensor.

4. The electronic device of claim 1, wherein the processor is further configured to control the display according to the brightness setting of the display.

5. The electronic device of claim 1, further comprising at least one memory for storing relation data between the identified illuminance of outside of the housing, the identified first brightness setting value of the display, the obtained sensing data from the sensor, and the identified image brightness ratio of the image displayed on the display.

6. The electronic device of claim 5, wherein the at least one memory is further configured to store a plurality of brightness values of the display corresponding to a plurality of brightness settings.

7. The electronic device of claim 5, wherein the identified image brightness ratio comprises white pattern and at least one of red pattern, green pattern, or blue pattern.

8. The electronic device of claim 1, wherein the processor is further configured to:
adjust an attribute of the display using first sensing data obtained by the sensor while a first image is displayed on the display and second sensing data obtained by the sensor when a second image is displayed on the display.

9. The electronic device of claim 8, wherein the first image and the second image are configured to allow the first sensing data and the second sensing data to have different values.

10. The electronic device of claim 9, wherein the first image and the second image are configured to have different image brightness ratios.

11. The electronic device of claim 8, wherein the attribute of the display comprises a brightness value or a gamma value.

12. The electronic device of claim 8, wherein the processor is further configured to:
obtain a difference value between the first sensing data and the second sensing data,
compare the obtained difference value with a prior difference value obtained under the same condition, and
when a difference between the obtained difference value and the prior difference value is identified, adjust the attribute of the display.

13. The electronic device of claim 12, wherein the processor is further configured to adjust the attribute of the display so that the obtained difference value corresponds to the prior difference value.

14. A method for operating an electronic device including a display and a sensor, the method comprising:
obtaining sensing data by the sensor for sensing light received through the display and light received from the display while the display displays an image;
identifying a first brightness setting value of the display;
identifying an image brightness ratio for the image currently displayed on the display;
identifying an illuminance of outside of a housing of the electronic device based on the obtained sensing data from the sensor, and compensation value, the compensation value corresponding to the identified first brightness setting value of the display and the identified image brightness ratio of the image among a pre-stored plurality of compensation values; and
setting a brightness setting of the display to a second brightness setting value determined based at least on the identified illuminance of the outside.

15. The method of claim 14, further comprising storing, in at least one memory of the electronic device, relation data between the identified illuminance of outside of the housing, the identified first brightness setting value of the display, the obtained sensing data from the sensor, and the identified image brightness ratio of an image displayed on the display.

16. The method of claim 14, further comprising:
obtaining first sensing data by the sensor for sensing light received through the display while a first image is displayed on the display;
obtaining second sensing data by the sensor while a second image is displayed on the display; and
adjusting an attribute of the display using the first sensing data and the second sensing data.

17. The method of claim 16, wherein the first image and the second image are configured to allow the first sensing data and the second sensing data to have different values or different image brightness ratios.

18. At least one non-transitory computer-readable recording medium retaining a program executed on an electronic device, wherein the program comprises instructions executed by at least one processor of the electronic device to enable the at least one processor to:
obtain sensing data by a sensor of the electronic device for sensing light received through a display of the electronic device and light received from the display while the display displays an image,
identify a first brightness setting value of the display,
identify an image brightness ratio for the image currently displayed on the display,
identify an illuminance of outside of a housing of the electronic device based on the obtained sensing data from the sensor and compensation value, the compensation value corresponding to the identified first brightness setting value of the display, and the identified image brightness ratio of the image among a pre-stored plurality of compensation values, and
set a brightness setting of the display to a second brightness setting value determined based at least on the identified illuminance of the outside.

* * * * *